US006440768B1

(12) United States Patent
Konishi et al.

(10) Patent No.: US 6,440,768 B1
(45) Date of Patent: Aug. 27, 2002

(54) THERMOELECTRIC SEMICONDUCTOR MATERIAL AND METHOD OF MANUFACTURING THE SAME

(75) Inventors: Akio Konishi; Katsushi Fukuda, both of Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 9 days.

(21) Appl. No.: 09/695,258

(22) Filed: Oct. 25, 2000

Related U.S. Application Data

(62) Division of application No. 09/361,202, filed on Jul. 26, 1999.

(30) Foreign Application Priority Data

Jul. 27, 1998 (JP) ............................................. 10-211544
Jul. 31, 1998 (JP) ............................................. 10-217755

(51) Int. Cl.$^7$ ........................... H01L 21/00; B22F 9/06; B22F 9/08; B22F 9/10; B22F 9/14

(52) U.S. Cl. .............................. 438/54; 419/52; 75/336; 75/345

(58) Field of Search ............................... 419/16, 31, 32, 419/39, 48, 52; 75/336, 345; 438/54, 21–47

(56) References Cited

U.S. PATENT DOCUMENTS

| 5,409,547 | A | * | 4/1995 | Watanabe et al. ............ 136/204 |
| 5,723,799 | A | * | 3/1998 | Murayama et al. ............ 75/232 |
| 5,929,351 | A | * | 7/1999 | Kusakabe et al. ............. 75/228 |
| 5,959,341 | A | * | 9/1999 | Tsuno et al. .................. 257/467 |
| 6,222,242 | B1 | * | 4/2001 | Konishi et al. ............... 257/467 |

OTHER PUBLICATIONS

Vedeneev et al. "Tin tellluride based thermoelectric alloys", Semiconductors 32 (3), 1998, p. 241.*
Alekseeva et al. "Hole Concentration and Thermoelectric Figure of Merit for PbSnTe:Te Solid Solutions". Semiconductors 34 (8), 2000, p. 897.*

* cited by examiner

Primary Examiner—John F. Niebling
Assistant Examiner—Viktor Simkovic
(74) Attorney, Agent, or Firm—Varndell & Varndell, PLLC

(57) ABSTRACT

The present invention provides a novel thermoelectric semiconductor material having excellent thermoelectric property which is not lowered like a conventional PbTe-based or PbSnTe-based semiconductor material even if a strength is improved by sintering. The thermoelectric semiconductor material of the invention is characterized by having chemical formula $AB_2X_4$ (where, A is a simple substance or mixture of Pb, Sn and Ge (IV family elements), B is a simple substance or mixture of Bi and Sb (V family elements), and X is a simple substance or mixture of Te and Se (VI family elements). In this case, a spark plasma sintering device is used to apply a pulsed current through the powder material to cause an electrical discharge among particles of the powder to synthesize the compound $AB_2X_4$ having a uniform structure.

And, the invention synthesizes a compound, which is to be a thermoelectric semiconductor material, so to have a uniform structure.

Using a spark plasma sintering device, a pulsed current is applied to the powder material to cause an electrical discharge among particles of the powder to synthesize compound $PbBi_2Te_4$ having a uniform structure.

17 Claims, 15 Drawing Sheets

| EMBODI-MENT | COMPOSITION | SINTERING CONDITIONS ||| CRYSTALLINE STRUCTURE |
|---|---|---|---|---|---|
| | | TEMPE-RATURE °C | TIME (h) | PRESSURE (kgf/cm²) | |
| 1 | $Pb\,Bi_2\,Te_4$ | 500 | 2 | 400 | Rucklidgeite |
| 2 | $Sn\,Bi_2\,Te_4$ | 500 | 2 | 400 | Rucklidgeite |
| 3 | $Ge\,Bi_2\,Te_4$ | 500 | 2 | 400 | Rucklidgeite |
| 4 | $Sn\,Sb_2\,Te_4$ | 500 | 2 | 400 | Rucklidgeite |
| 5 | $Ge\,Sb_2\,Te_4$ | 500 | 2 | 400 | Rucklidgeite |
| 6 | $Pb_{0.75}\,Sn_{0.25}\,Bi_2\,Te_4$ | 500 | 2 | 400 | Rucklidgeite |
| 7 | $Pb_{0.5}\,Sn_{0.5}\,Bi_2\,Te_4$ | 500 | 2 | 400 | Rucklidgeite |
| 8 | $Pb_{0.25}\,Sn_{0.75}\,Bi_2\,Te_4$ | 500 | 2 | 400 | Rucklidgeite |
| 9 | $Pb_{0.1}\,Sn_{0.9}\,Bi_2\,Te_4$ | 500 | 2 | 400 | Rucklidgeite |
| 10 | $Pb\,Bi_2\,Te_{3.7}\,Se_{0.3}$ | 500 | 2 | 400 | Rucklidgeite |
| 11 | $Sn\,Bi_2\,Te_{3.7}\,Se_{0.3}$ | 500 | 2 | 400 | Rucklidgeite |
| 12 | $Pb\,Bi_{0.5}\,Sb_{1.5}\,Te_4$ | 500 | 2 | 400 | Rucklidgeite |
| 13 | $Sn\,Bi_{0.5}\,Sb_{1.5}\,Te_4$ | 500 | 2 | 400 | Rucklidgeite |
| 14 | $Bi_1\,Te_1$ | 450 | 2 | 400 | Tsumoite |
| 15 | $Bi_{0.9}\,Sb_{0.1}\,Te$ | 450 | 2 | 400 | Tsumoite |
| 16 | $Bi_{0.8}\,Sb_{0.2}\,Te$ | 450 | 2 | 400 | Tsumoite |
| 17 | $Bi_{0.5}\,Sb_{0.5}\,Te$ | 450 | 2 | 400 | Tsumoite |
| 18 | $Bi_{0.3}\,Sb_{0.7}\,Te$ | 450 | 2 | 400 | Tsumoite |
| 19 | $Bi_{0.2}\,Sb_{0.8}\,Te$ | 450 | 2 | 400 | Tsumoite |
| 20 | $Sb_1\,Te_1$ | 450 | 2 | 400 | Tsumoite |
| 21 | $Ge_{0.1}\,Bi_{0.9}\,Te$ | 450 | 2 | 400 | Tsumoite |
| 22 | $Ge_{0.2}\,Bi_{0.8}\,Te$ | 450 | 2 | 400 | Tsumoite |
| 23 | $Ge_{0.25}\,Bi_{0.75}\,Te$ | 450 | 2 | 400 | Tsumoite |
| 24 | $Ge_{0.3}\,Bi_{0.7}\,Te$ | 450 | 2 | 400 | Tsumoite + GeTe |
| 25 | $Sn_{0.1}\,Bi_{0.9}\,Te$ | 450 | 2 | 400 | Tsumoite |
| 26 | $Sn_{0.2}\,Bi_{0.8}\,Te$ | 450 | 2 | 400 | Tsumoite |
| 27 | $Sn_{0.25}\,Bi_{0.75}\,Te$ | 450 | 2 | 400 | Tsumoite |
| 28 | $Sn_{0.3}\,Bi_{0.7}\,Te$ | 450 | 2 | 400 | Tsumoite + SnTe |
| 29 | $Pb_{0.1}\,Bi_{0.9}\,Te$ | 450 | 2 | 400 | Tsumoite |
| 30 | $Pb_{0.2}\,Bi_{0.8}\,Te$ | 450 | 2 | 400 | Tsumoite |
| 31 | $Pb_{0.25}\,Bi_{0.75}\,Te$ | 450 | 2 | 400 | Tsumoite |
| 32 | $Pb_{0.3}\,Bi_{0.7}\,Te$ | 450 | 2 | 400 | Tsumoite + PbTe |

FIG.1

| EXAMPLE | COMPOSITION | CONDUCTION TYPE | POWER FACTOR ($\times 10^{-5}$W/cmK$^2$) | THERMAL CONDUCTIVITY $\kappa$(mW/cmK) | FIGURE OF MERIT Z ($\times 10^{-3}$/K) at 500K |
|---|---|---|---|---|---|
| 1 | Pb Bi$_2$ Te$_4$ | n | 1.8 | 20 | 0.9 |
| 2 | Sn Bi$_2$ Te$_4$ | p | 1.2 | 12 | 1.0 |
| 3 | Ge Bi$_2$ Te$_4$ | p | 1.5 | 14 | 1.1 |
| 4 | Sn Sb$_2$ Te$_4$ | n | 1.7 | 19 | 0.9 |
| 5 | Ge Sb$_2$ Te$_4$ | p | 1.7 | 18 | 0.9 |
| 6 | Pb$_{0.75}$ Sn$_{0.25}$ Bi$_2$ Te$_4$ | n | 1.6 | 16 | 1.0 |
| 7 | Pb$_{0.5}$ Sn$_{0.5}$ Bi$_2$ Te$_4$ | n | 1.2 | 14 | 0.9 |
| 8 | Pb$_{0.25}$ Sn$_{0.75}$ Bi$_2$ Te$_4$ | n | 1.1 | 12 | 0.9 |
| 9 | Pb$_{0.1}$ Sn$_{0.9}$ Bi$_2$ Te$_4$ | p | 1.4 | 14 | 1.0 |
| 10 | Pb Bi$_2$ Te$_{3.7}$ Se$_{0.3}$ | n | 1.8 | 15 | 1.2 |
| 11 | Sn Bi$_2$ Te$_{3.7}$ Se$_{0.3}$ | p | 1.2 | 10 | 1.2 |
| 12 | Pb Bi$_{0.5}$ Sb$_{1.5}$ Te$_4$ | p | 1.1 | 11 | 1.0 |
| 13 | Sn Bi$_{0.5}$ Sb$_{1.5}$ Te$_4$ | p | 1.4 | 18 | 0.8 |
| 14 | Bi$_1$ Te$_1$ | n | 1.8 | 31 | 0.6 |
| 15 | Bi$_{0.9}$ Sb$_{0.1}$ Te | n | 2.2 | 28 | 0.8 |
| 16 | Bi$_{0.8}$ Sb$_{0.2}$ Te | n | 2.7 | 27 | 1.0 |
| 16-2 | Bi$_{0.7}$ Sb$_{0.3}$ Te | n | 2.9 | 25 | 1.2 |
| 16-3 | Bi$_{0.6}$ Sb$_{0.4}$ Te | n | 2.5 | 25 | 1.0 |
| 17 | Bi$_{0.5}$ Sb$_{0.5}$ Te | n | 0.3 | 27 | 0.1 |
| 17-2 | Bi$_{0.4}$ Sb$_{0.6}$ Te | n | 2.2 | 25 | 0.9 |
| 18 | Bi$_{0.3}$ Sb$_{0.7}$ Te | p | 2.2 | 25 | 0.9 |
| 19 | Bi$_{0.2}$ Sb$_{0.8}$ Te | p | 2.1 | 26 | 0.8 |
| 19-2 | Bi$_{0.1}$ Sb$_{0.9}$ Te | p | 2.1 | 27 | 0.8 |
| 20 | Sb$_1$ Te$_1$ | p | 1.6 | 28 | 0.6 |
| 21 | Ge$_{0.1}$ Bi$_{0.9}$ Te | n | 1.8 | 20 | 0.9 |
| 22 | Ge$_{0.2}$ Bi$_{0.8}$ Te | n | 2.1 | 18 | 1.2 |
| 23 | Ge$_{0.25}$ Bi$_{0.75}$ Te | n | 2.2 | 18 | 1.2 |
| 25 | Sn$_{0.1}$ Bi$_{0.9}$ Te | n | 1.8 | 22 | 0.8 |
| 26 | Sn$_{0.2}$ Bi$_{0.8}$ Te | n | 2.0 | 20 | 1.0 |
| 27 | Sn$_{0.25}$ Bi$_{0.75}$ Te | n | 2.1 | 19 | 1.1 |
| 29 | Pb$_{0.1}$ Bi$_{0.9}$ Te | n | 1.8 | 24 | 0.7 |
| 30 | Pb$_{0.2}$ Bi$_{0.8}$ Te | n | 1.9 | 22 | 0.9 |
| 31 | Pb$_{0.25}$ Bi$_{0.75}$ Te | n | 2.0 | 20 | 1.0 |
| COMPARATIVE EXAMPLE 1 | Pb Te + 0.5wt% PbI$_2$ | n | 1.8 | 25 | 0.7 |
| COMPARATIVE EXAMPLE 2 | Pb$_{0.75}$ Sn$_{0.25}$ Te | p | 1.6 | 26 | 0.6 |

FIG.2

| PUBLICATION DATA Rucklidgeite | | | |
|---|---|---|---|
| d (A) | INDEX OF THE PLANE | | |
| | h | k | l |
| 13.83 | 0 | 0 | 3 |
| 6.92 | 0 | 0 | 6 |
| 4.61 | 0 | 0 | 9 |
| 3.79 | 0 | 1 | 2 |
| 3.23 | 1 | 0 | 7 |
| 2.82 | 1 | 0 | 10 |
| 2.46 | 1 | 0 | 13 |
| 2.35 | 0 | 1 | 14 |
| 2.22 | 1 | 1 | 0 |
| 2.15 | 1 | 0 | 16 |
| 1.978 | 0 | 0 | 21 |
| 1.828 | 0 | 1 | 20 |
| 1.635 | 0 | 1 | 23 |
| 1.614 | 2 | 0 | 14 |
| 1.478 | 1 | 1 | 21 |

FIG.4

| PUBLICATION DATA Tsumoite | | | |
|---|---|---|---|
| d (A) | INDEX OF THE PLANE | | |
| | h | k | l |
| 4.808 | 0 | 0 | 5 |
| 3.779 | 1 | 0 | 1 |
| 3.453 | 1 | 0 | 3 |
| 3.229 | 1 | 0 | 4 |
| 2.766 | 1 | 0 | 6 |
| 2.365 | 1 | 0 | 8 |
| 2.211 | 1 | 1 | 0 |
| 2.191 | 1 | 0 | 9 |
| 2.004 | 0 | 0 | 12 |
| 1.825 | 2 | 0 | 4 |
| 1.666 | 1 | 0 | 13 |
| 1.614 | 2 | 0 | 8 |
| 1.556 | 2 | 0 | 9 |
| 1.485 | 1 | 1 | 12 |

FIG.5

| SYNTHESIZING EXAMPLE | COMPOSITION | SYNTHESIZING METHOD | MATERIAL COMPOUND | TEMPERATURE (°C) | TIME (h) | SYNTHESIZED RESULT |
|---|---|---|---|---|---|---|
| 4 | $SnBi_2Te_4$ | 1,2 | $SnTe, Bi_2Te_3$ | 500 | 2 | ○ |
| 5 | $GeBi_2Te_4$ | 1,2 | $GeTe, Bi_2Te_3$ | 500 | 2 | ○ |
| 6 | $SnSb_2Te_4$ | 1,2 | $SnTe, Sb_2Te_3$ | 500 | 2 | ○ |
| 7 | $GeSb_2Te_4$ | 1,2 | $GeTe, Sb_2Te_3$ | 500 | 2 | ○ |
| 8 | $Pb_{0.5}Sn_{0.5}Bi_2Te_4$ | 1,2 | $PbTe, SnTe, Bi_2Te_3$ | 500 | 2 | ○ |
| 9 | $PbBi_2Te_{3.7}Se_{0.3}$ | 1,2 | $PbTe, Bi_2Te_3, Bi_2Se_3$ | 500 | 2 | ○ |
| 10 | $SnBi_2Te_{3.7}Se_{0.3}$ | 1,2 | $SnTe, Bi_2Te_3, Bi_2Se_3$ | 500 | 2 | ○ |
| 11 | $PbBi_{0.5}Sb_{1.5}Te_4$ | 1,2 | $PbTe, Bi_2Te_3, Sb_2Se_3$ | 500 | 2 | ○ |
| 12 | $SnBi_{0.5}Sb_{1.5}Te_4$ | 1,2 | $SnTe, Bi_2Te_3, Sb_2Se_3$ | 500 | 2 | ○ |
| 13 | $Bi_1Te_1$ | 1 | $Bi_1Te_1, Sb_1Te_1$ | 450 | 2 | ○ |
| 14 | $Bi_{0.8}Sb_{0.2}Te$ | 1,2 | | 450 | 2 | ○ |
| 15 | $Sb_1Te_1$ | 1 | | 450 | 2 | ○ |
| 16 | $Ge_{0.2}Bi_{0.8}Te$ | 1,2 | $GeTe, Bi_1Te_1$ | 450 | 2 | ○ |
| 17 | $Sn_{0.2}Bi_{0.8}Te$ | 1,2 | $SnTe, Bi_1Te_1$ | 450 | 2 | ○ |
| 18 | $Pb_{0.2}Bi_{0.8}Te$ | 1,2 | $PbTe, Bi_1Te_1$ | 450 | 2 | ○ |
| 19 | $PbBi_2Te_4$ | HOT PRESS | $PbTe, Bi_2Te_3$ | 500 | 2 | × |

FIG.11

| EMBODI-MENT | COMPOSITION | SINTERING CONDITIONS ||| CRYSTALLINE STRUCTURE |
|---|---|---|---|---|---|
| | | TEMPE-RATURE °C | TIME (h) | PRESSURE (kgf/cm²) | |
| 101 | $Bi_1 Te_{0.8} Se_{0.2}$ | 450 | 2 | 400 | Tsumoite |
| 102 | $Bi_1 Te_{0.6} Se_{0.4}$ | 450 | 2 | 400 | Tsumoite |
| 103 | $Bi_1 Te_{0.4} Se_{0.6}$ | 450 | 2 | 400 | Tsumoite |
| 104 | $Bi_1 Te_{0.2} Se_{0.8}$ | 450 | 2 | 400 | Tsumoite |
| 105 | $Bi_1 Se_1$ | 450 | 2 | 400 | Tsumoite |
| 106 | $Bi_{0.8} Sb_{0.2} Te_{0.8} Se_{0.2}$ | 450 | 2 | 400 | Tsumoite |
| 107 | $Bi_{0.8} Sb_{0.2} Te_{0.6} Se_{0.4}$ | 450 | 2 | 400 | Tsumoite |
| 108 | $Bi_{0.8} Sb_{0.2} Te_{0.4} Se_{0.6}$ | 450 | 2 | 400 | Tsumoite |
| 109 | $Bi_{0.8} Sb_{0.2} Te_{0.2} Se_{0.8}$ | 450 | 2 | 400 | Tsumoite |
| 110 | $Bi_{0.8} Sb_{0.2} Se$ | 450 | 2 | 400 | Tsumoite |
| 111 | $Bi_{0.6} Sb_{0.4} Te_{0.8} Se_{0.2}$ | 450 | 2 | 400 | Tsumoite |
| 112 | $Bi_{0.6} Sb_{0.4} Te_{0.6} Se_{0.4}$ | 450 | 2 | 400 | Tsumoite |
| 113 | $Bi_{0.6} Sb_{0.4} Te_{0.4} Se_{0.6}$ | 450 | 2 | 400 | Tsumoite |
| 114 | $Bi_{0.6} Sb_{0.4} Te_{0.2} Se_{0.8}$ | 450 | 2 | 400 | Tsumoite |
| 115 | $Bi_{0.6} Sb_{0.4} Se$ | 450 | 2 | 400 | Tsumoite |
| 116 | $Bi_{0.4} Sb_{0.6} Te_{0.8} Se_{0.2}$ | 450 | 2 | 400 | Tsumoite |
| 117 | $Bi_2 Te_1$ | 300 | 2 | 400 | |
| 118 | $Bi_{1.2} Sb_{0.8} Te_1$ | 300 | 2 | 400 | |
| 119 | $Sb_2 Te_1$ | 300 | 2 | 400 | |
| 120 | $Bi_2 Te_{0.8} Se_{0.2}$ | 300 | 2 | 400 | |
| 121 | $Bi_2 Te_{0.4} Se_{0.6}$ | 300 | 2 | 400 | |
| 122 | $Bi_2 Se_1$ | 300 | 2 | 400 | |
| 123 | $Bi_{1.4} Sb_{0.6} Te_{0.8} Se_{0.2}$ | 300 | 2 | 400 | |
| 124 | $Bi_1 Te_5$ | 450 | 2 | 400 | |
| 125 | $Bi_1 Se_5$ | 450 | 2 | 400 | |
| 126 | $Bi_1 Te_5 Se_2$ | 450 | 2 | 400 | |
| 127 | $Bi_{3.2} Sb_{0.8} Te_5$ | 450 | 2 | 400 | |
| 128 | $Bi_2 Sb_2 Te_5$ | 450 | 2 | 400 | |
| 129 | $Bi_2 Sb_2 Te_3 Se_2$ | 450 | 2 | 400 | |
| 130 | $Bi_{3.2} Sb_{0.8} Te_4 Se_1$ | 450 | 2 | 400 | |
| 131 | $Sb_4 Te_5$ | 450 | 2 | 400 | |

FIG.15

| EMBODIMENT | COMPOSITION | CONDUCTION TYPE | POWER FACTOR ($\times 10^{-3}$W/cmK$^2$) | THERMAL CONDUCTIVITY $\kappa$(mW/cmK) | FIGURE OF MERIT Z ($\times 10^{-3}$/K) at 500K |
|---|---|---|---|---|---|
| 101 | Bi$_1$ Te$_{0.8}$ Se$_{0.2}$ | n | 2.1 | 27 | 0.8 |
| 102 | Bi$_1$ Te$_{0.6}$ Se$_{0.4}$ | n | 2.1 | 26 | 0.8 |
| 103 | Bi$_1$ Te$_{0.4}$ Se$_{0.6}$ | n | 2.0 | 23 | 0.9 |
| 104 | Bi$_1$ Te$_{0.2}$ Se$_{0.8}$ | n | 1.9 | 24 | 0.8 |
| 105 | Bi$_1$ Se$_1$ | n | 1.9 | 25 | 0.8 |
| 106 | Bi$_{0.8}$ Sb$_{0.2}$ Te$_{0.8}$ Se$_{0.2}$ | n | 2.8 | 25 | 1.1 |
| 107 | Bi$_{0.8}$ Sb$_{0.2}$ Te$_{0.6}$ Se$_{0.4}$ | n | 2.8 | 23 | 1.2 |
| 108 | Bi$_{0.8}$ Sb$_{0.2}$ Te$_{0.4}$ Se$_{0.6}$ | n | 2.8 | 23 | 1.2 |
| 109 | Bi$_{0.8}$ Sb$_{0.2}$ Te$_{0.2}$ Se$_{0.8}$ | n | 2.5 | 24 | 1.0 |
| 110 | Bi$_{0.8}$ Sb$_{0.2}$ Se | n | 2.3 | 25 | 0.9 |
| 111 | Bi$_{0.6}$ Sb$_{0.4}$ Te$_{0.8}$ Se$_{0.2}$ | n | 2.0 | 15 | 1.3 |
| 112 | Bi$_{0.6}$ Sb$_{0.4}$ Te$_{0.6}$ Se$_{0.4}$ | n | 2.0 | 14 | 1.4 |
| 113 | Bi$_{0.6}$ Sb$_{0.4}$ Te$_{0.4}$ Se$_{0.6}$ | n | 1.9 | 15 | 1.2 |
| 114 | Bi$_{0.6}$ Sb$_{0.4}$ Te$_{0.2}$ Se$_{0.8}$ | n | 1.7 | 14 | 1.2 |
| 115 | Bi$_{0.6}$ Sb$_{0.4}$ Se | n | 1.5 | 14 | 1.1 |
| 116 | Bi$_{0.4}$ Sb$_{0.6}$ Te$_{0.8}$ Se$_{0.2}$ | p | 2.2 | 21 | 1.0 |
| 117 | Bi$_2$ Te$_1$ | p | 2.0 | 25 | 0.8 |
| 118 | Bi$_{1.2}$ Sb$_{0.8}$ Te$_1$ | p | 1.8 | 19 | 0.9 |
| 119 | Sb$_2$ Te$_1$ | p | 1.8 | 22 | 0.8 |
| 120 | Bi$_2$ Te$_{0.8}$ Se$_{0.2}$ | p | 2.1 | 23 | 0.9 |
| 121 | Bi$_2$ Te$_{0.4}$ Se$_{0.6}$ | p | 2.0 | 21 | 0.9 |
| 122 | Bi$_2$ Se$_1$ | p | 1.8 | 20 | 0.9 |
| 123 | Bi$_{1.4}$ Sb$_{0.6}$ Te$_{0.8}$ Se$_{0.2}$ | p | 1.7 | 18 | 0.9 |
| 124 | Bi$_1$ Te$_5$ | n | 1.8 | 19 | 0.9 |
| 125 | Bi$_1$ Se$_5$ | n | 1.7 | 17 | 1.0 |
| 126 | Bi$_1$ Te$_5$ Se$_2$ | n | 1.8 | 16 | 1.1 |
| 127 | Bi$_{3.2}$ Sb$_{0.8}$ Te$_5$ | p | 1.9 | 17 | 1.1 |
| 128 | Bi$_2$ Sb$_2$ Te$_5$ | p | 1.9 | 16 | 1.2 |
| 129 | Bi$_2$ Sb$_2$ Te$_3$ Se$_2$ | p | 1.8 | 15 | 1.2 |
| 130 | Bi$_{3.2}$ Sb$_{0.8}$ Te$_4$ Se$_1$ | p | 1.7 | 15 | 1.1 |
| 131 | Sb$_4$ Te$_5$ | p | 1.7 | 19 | 0.9 |
| COMPARATIVE EXAMPLE 1 | Pb Te + 0.5wt% PbI$_2$ | n | 1.8 | 25 | 0.7 |
| COMPARATIVE EXAMPLE 2 | Pb$_{0.75}$ Sn$_{0.25}$ Te | p | 1.6 | 26 | 0.6 |

THERMOELECTRIC SEMICONDUCTOR MATERIAL AND METHOD OF MANUFACTURING THE SAME

CROSS-REFERENCE TO BELATED APPLICATION

This application is a divisional application of U.S. Ser. No. 09/361,202 filed Jul. 26, 1999, now pending.

BACKGROUND OF THE INVENTION

1. Field of the Invention The present-invention relates to a thermoelectric semiconductor material and a method for manufacturing same.

2. Description of the Related Art

A thermoelectric cooling element which uses Peltier effect or Ettingshausen effect or a thermoelectric power generation element which uses Seebeck effect is attracting attention in the point that it can be used over the wide range because it has a simple structure, is handled easily and keeps stable characteristics. Particularly, as a thermoelectric cooling element can control a local cooling and a precise temperature in the vicinity of room temperature, its extensive research and development are being made for its application to optoelectronics, temperature control of semiconductor lasers, a small refrigerator and the like.

A material of the thermoelectric element used for the thermoelectric refrigeration and thermoelectric generation electricity has a figure of merit $Z(=\alpha^2/\rho\kappa)$ represented by Seebeck coefficient $\alpha$, electrical resistivity $\rho$ and thermal conductivity $\kappa$, which are peculiar constants of the material in a range of temperatures it is used.

Specifically, a crystal material generally used for thermoelectric cooling element and the like includes mixed crystal such as bismuth telluride ($Bi_2Te_3$), antimony telluride ($Sb_2Te_3$), and bismuth selenide ($Bi_2Se_3$).

Such $Bi_2Te_3$ based semiconductor materials, e.g., bismuth telluride ($Bi_2Te_3$) and antimony telluride ($Sb_2Te_3$), have a layer structure as shown in FIG. 10. Specifically, Te, Bi (or Sb), Te, Bi (or Sb) and Te are bonded sequentially from top to bottom into a five-layer form by covalent bonding. And, three of such five-layer forms are bonded into one 15-layer unit by Van der Waals bonding or ionic bonding so to form a stratified layer crystalline structure.

Meanwhile, a PbTe-based or PbSnTe-based semiconductor material is used as a thermoelectric conversion material used in a middle temperature range (from room temperature to 400° C.).

Such PbTe-based and PbSnTe-based semiconductor materials have high mobility of a carrier in the crystal. This semiconductor material provides a remarkable thermoelectric property when it is in a monocrystalline state or formed into a polycrystalline ingot material by solidifying in one direction.

But, since its material strength is low for industrial use, it is necessary to improve the strength by forming into a sintered body.

However, the sintered body has an increased resistance and a lowered thermoelectric property because an influence of scattering in a grain field due to high carrier mobility.

As described above, the crystal material generally used for the thermoelectric cooling element or the like includes mixed crystals such as bismuth telluride ($Bi_2Te_3$), antimony telluride ($Sb_2Te_3$), and bismuth selenide ($Bi_2Se_3$).

Conventionally, a method for synthesizing a compound consisting of a plurality of elements as described above was a "melting and solidifying method" which seals raw material elements into a glass tube, melts them to synthesize in a liquid phase, and cools to solidify.

The above melting and solidifying method may not provide a uniform phase because two phases are formed depending on the composition of the compound during solidifying by simply cooling a liquid phase.

For example, it is assumed that compound $PbBi_2Te_4$ is synthesized.

The compound $PbBi_2Te_4$ is a compound having PbTe and $Bi_2Te_3$ mixed at a stoichiometric ratio of 1:1. The phase diagram of this $PbTe-Bi_2Te_3$ alloy is shown in FIG. 12. It is apparent from the drawing that when $PbBi_2Te_4$ is synthesized by the melting and solidifying method, a compound having a uniform structure cannot be obtained because it is separated into a compound which includes PbTe excessively than the target composition $PbBi_2Te_4$ and a compound which includes $Bi_2Te_3$ excessively than the target composition $PbBi_2Te_4$.

Specifically, a composition of 50 mol % $Bi_2Te_3$-50 mol % PbTe is indicated by straight line 1 in FIG. 12. The solid $PbBi_2Te_4$ compound is formed when a temperature is below horizontal line 5 on the straight line 1. Then, when a solute, which was prepared by weighing to have the aforesaid composition and dissolving, is cooled down to temperature $T_1$ (melting point) at point A where the straight line 1 intersects with liquidus line 2, a solid of composition 4 corresponding to point B (temperature $T_1$) on solidus line 3 is precipitated from the solute.

When the temperature is further lowered, the composition of the solute changes from point A to point C, and the composition of the precipitated solid changes from point B to point D. Upon reaching temperature $T_2$ of the horizontal line 5, the solute of the composition at point C and the solid of the composition at point D are present at the same time. At temperature $T_2$, the solute at point C reacts with the solid at point D. If temperature $T_2$ can be maintained for a sufficient period of time, the solute at point C and the solid at point D are fully reacted, and the compound of composition $PbBi_2Te_4$ at point C can be formed uniformly. But, it is practically difficult to keep a fixed temperature for a very long period, and a compound having a different composition is precipitated due to a little change in temperature. As a result, a solid obtained by cooling contains the compound having the composition in the vicinity of point C and the compound of the composition in the vicinity of point D in addition to the desired $PbBi_2Te_4$ compound.

Accordingly, for such a compound which cannot be provided with a uniform phase by the melting and solidifying method, a zone melting method or a zone leveling method can be used.

But, an apparatus for conducting the zone melting method or the zone leveling method is complex and expensive. And, an obtained ingot often has a portion with a composition different from the target composition, resulting in a poor yield.

Meanwhile, a solid phase reaction which synthesizes at a temperature lower than the melting point may be applied in order to prevent the separation into two phases at the time of soldering.

But, a long period of tens of hours is necessary to fully complete the reaction by the solid phase reaction. Thus, a production efficiency becomes poor and a production cost is high.

SUMMARY OF THE INVENTION

The present invention was achieved in view of the aforesaid circumstances. And it is an object of the invention to provide a new thermoelectric semiconductor material with an improved thermoelectric property by having the similar uniform phase layer structure as shown in FIG. 10 even if the material is sintered as compared with a conventional PbTe-based or PbSnTe-based semiconductor material.

Accordingly, a thermoelectric semiconductor material according to a first aspect of the invention has chemical formula $AB_2X_4$ (where, A is a simple substance or mixture of Pb, Sn and Ge (IV family elements), B is a simple substance or mixture of Bi and Sb (V family elements), and X is a simple substance or mixture of Te and Se (VI family elements)).

A thermoelectric semiconductor material according to a second aspect of the invention has chemical formula $Bi_{1-x}Sb_xTe_1$ (where, $0 \leq x \leq 1$).

A thermoelectric semiconductor material according to a third aspect of the invention has chemical formula $A_yB_{1-y}X_1$ (where, $0 \leq y \leq 0.25$, A is a simple substance or mixture of Pb, Sn and Ge (IV family elements), B is a simple substance or mixture of Bi and Sb (V family elements), and X is a simple substance or mixture of Te and Se (VI family elements)).

A method of producing a thermoelectric semiconductor material according to a fourth aspect of the invention comprises synthesizing a compound having a uniform structure represented by chemical formula $AB_2X_4$, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current to material powder for the thermoelectric semiconductor material having the A, B and X mixed in a stoichiometric ratio of 1:2:4 to cause an electrical discharge among particles of the powder.

A method of-producing a thermoelectric semiconductor material according to a fifth aspect of the invention comprises synthesizing a compound having a uniform structure represented by chemical formula $Bi_{1-x}Sb_xTe_1$ by applying a pulsed current to material powder for the thermoelectric semiconductor material having Bi, Sb and Te mixed in a stoichiometric ratio of 1–x:x:1 (where, $0 \leq x \leq 1$) to cause an electrical discharge among the particles of the powder.

A method of producing a thermoelectric semiconductor material according to a sixth aspect of the invention comprises synthesizing a compound having a uniform structure represented by chemical formula $A_yB_{1-y}X_1$, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current to material powder for the thermoelectric semiconductor material having the A, B and X mixed in a stoichiometric ratio of y:1–y:1 (where, $0 \leq y \leq 0.25$) to cause an electrical discharge among particles of the powder.

A method of producing a thermoelectric semiconductor material according to a seventh aspect of the invention comprises synthesizing a compound having a uniform structure represented by chemical formula $AB_2X_4$ as well as forming a sintered body of the compound, where A is a simple substance or mixture of Pb, Sn and Ge (IV family elements), B is a simple substance of mixture of Bi and Sb (V family elements), and X is a simple substance or mixture of Te and Se (VI family elements), by applying a pulsed current and a pressure to material powder for the thermoelectric semiconductor material having A, B and X mixed in a stoichiometric ratio of 1:2:4 to cause an electrical discharge among particles of the powder.

A method of producing a thermoelectric semiconductor material according to an eighth aspect of the invention comprises synthesizing a compound having a uniform structure represented by chemical formula $Bi_{1-x}Sb_xTe_1$, as well as forming a sintered body of the compound by applying a pulsed current and a pressure to material powder for the thermoelectric semiconductor material having Bi, Sb and Te mixed in a stoichiometric ratio of 1–x:x:1 (where, $0 \leq x \leq 1$) to cause an electrical discharge among particles of the powder.

A method of producing a thermoelectric semiconductor material according to a ninth aspect of the invention comprises synthesizing a compound having a uniform structure represented by chemical formula $A_yB_{1-y}X_1$ as well as forming a sintered body of the compound, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current and a pressure to material powder for the thermoelectric semiconductor material having A, B and X mixed in a stoichiometric ratio of y:1–y:1 (where, $0 \leq y \leq 0.25$) to cause an electrical discharge among particles of the powder.

A thermoelectric semiconductor material according to a sixteenth aspect-of the invention has chemical formula $Bi_{1-x}Sb_xTe_{1-y}Se_y$ (where, $0 \leq x \leq 1$ and $0 \leq y_{23}\ 1$).

A thermoelectric semiconductor material according to a seventeenth aspect of the invention has chemical formula $Bi_{2-x}Sb_xTe_{1-y}Se_y$ (where, $0 \leq x \leq 2$ and $0 \leq y \leq 1$).

A thermoelectric semiconductor material according-to an eighteenth aspect of the invention has chemical formula $(Bi_{1-x}Sb_x)_4(Te_{1-y}Se_y)_5$ (where, $0 \leq x \leq 1$ and $0 \leq y \leq 1$).

A method of producing a thermoelectric semiconductor material according to a nineteenth aspect of the invention comprises synthesizing a compound having a uniform structure represented by chemical formula $Bi_{1-x}Sb_xTe_{1-y}Se_y$ by applying a pulsed current to material powder for the thermoelectric semiconductor material having Bi, Sb, Te and Se mixed in a stoichiometric ratio of 1–x:x:1–y:y (where, $0x \leq x \leq 1$ and $0 < y \leq 1$) to cause an electrical discharge among particles of the powder.

A method of producing a thermoelectric semiconductor material according to a twentieth aspect of the invention comprises synthesizing a compound having a uniform structure represented by chemical formula $Bi_{2-x}Sb_xTe_{1-y}Se_y$ by applying a pulsed current to material powder for the thermoelectric semiconductor material having Bi, Sb, Te and Se mixed in a stoichiometric ratio of 2–x:x:1–y:y (where, $0 \leq x_{23}\ 2$ and $0 \leq y \leq 1$) to cause an electrical discharge among particles of the powder.

A method of producing a thermoelectric semiconductor material according to a twenty-first aspect of the invention comprises synthesizing a compound having a uniform structure represented by chemical formula $(Bi_{1-x}Sb_x)_4(Te_{1-y}Se_y)_5$ by applying a pulsed current to material powder for the thermoelectric semiconductor material having Bi, Sb, Te and Se mixed in a stoichiometric ratio of 4(1–x):4x:5(1–y):5y (where, $0 \leq x \leq 1$ and $0 \leq x \leq 1$ to cause an electrical discharge among particles of the powder.

According to the first, fourth and seventh aspects of the invention, the thermoelectric semiconductor material is characterized by having the chemical formula $AB_2X_4$ (where, A is a simple substance or mixture of Pb, Sn and Ge (IV family elements), B is a simple substance or mixture of Bi and Sb (V family elements), and X is a simple substance or mixture of Te and Se (VI family elements)). In this case, spark plasma sintering device 10 is used to apply a pulsed current through powdered material 14 to cause the electrical discharge among particles of the powder to synthesize compound $AB_2X_4$ having a uniform structure. And, the compound and the sintered body may be formed at the same time. According to the present invention, the Rucklidgeite layered structure with a uniform phase can be obtained as shown in FIG. 8, so that even when the sintering is performed, the thermoelectric property can be kept at a high value because thermal conductivity κ becomes low and figure of merit Z becomes high than the conventional PbTe-based semiconductor material.

According to the second, fifth and eighth aspects of the invention, the thermoelectric semiconductor material is characterized by having the chemical formula $Bi_{1-x}Sb_xTe_1$ (where, $0 \leq x \leq 1$). In this case, the spark plasma sintering device 10 is used to apply a pulsed current through the powdered material 14 to cause the electrical discharge among particles of the powder to synthesize compound $Bi_{1-x}Sb_xTe_1$ having a uniform structure. And, the compound and the sintered body may be formed at the same time. According to the present invention, the Tsumoite layered structure with a uniform phase can be obtained as shown in FIG. 9, so that even when the sintering is performed, the thermoelectric property can be kept at a high value because thermal conductivity κ becomes low and figure of merit Z becomes high than the conventional PbTe-based semiconductor material.

According to the third, sixth and ninth aspects of the invention, the thermoelectric semiconductor material of the invention is characterized by having the chemical formula $A_YB_{1-Y}X_1$ (where, $0 \leq y \leq 0.25$, A is a simple substance or mixture of Pb, Sn and Ge (IV family elements), B is a simple substance or mixture of Bi and Sb (V family elements), and X is a simple substance or mixture of Te and Se (VI family elements)). In this case, the spark plasma sintering device 10 is used to apply a pulsed current through the powdered material 14 to cause the electrical discharge among particles of the powder to synthesize compound $A_YB_{1-Y}X_1$ having a uniform structure. And, the compound and the sintered body may be formed at the same time. According to the present invention, the Tsumoite layered structure with a uniform phase can be obtained as shown in FIG. 9, so that even when the sintering is performed, the thermoelectric property can be kept at a high value because thermal conductivity x becomes low and figure of merit Z becomes high than the conventional PbTe-based semiconductor material.

According to the sixteenth and nineteenth aspects of the invention, the Tsumoite layered structure can be obtained, so that even when the sintering is performed, the thermoelectric property can be kept at a high value because thermal conductivity κ becomes low and figure of merit Z becomes high than the conventional PbTe-based semiconductor material.

According to the seventeenth, eighteenth, twentieth and twenty-first aspects of the invention, the figure of merit equivalent to or higher than the PbTe-based semiconductor material can be obtained, so that the thermoelectric semiconductor material of the invention is effective as a thermoelectric semiconductor material at a middle temperature range instead of the conventional PbTe-based semiconductor material.

And, it is an object of the present invention to provide a method which can produce a compound usable as the thermoelectric semiconductor material so to have a uniform structure and also can produce it efficiently.

Therefore, a method of producing a thermoelectric semiconductor material according to a tenth aspect of the invention is characterized by having a synthesizing step for synthesizing a compound having a uniform structure by applying a pulsed current through material powder for a thermoelectric semiconductor material having a desired structure to cause an electrical discharge among the particles of the powder.

In a method of producing a thermoelectric semiconductor material according to an eleventh aspect of the invention, the material powder for the thermoelectric semiconductor material having the desired structure according to the tenth aspect of the invention is a mixture of powder of at least two kinds of elements or alloys, and the synthesized compound is a new kind of compound different from the at least two kinds of elements or alloys.

In a method of producing a thermoelectric semiconductor material according to a twelfth aspect of the invention, the material powder for the thermoelectric semiconductor material having the desired structure according to the tenth aspect of the invention is a mixture of powder of at least two kinds of elements.

A method of producing a thermoelectric semiconductor material according to a thirteenth aspect of the invention comprises:

a step of mixing respective elements as raw materials for the thermoelectric semiconductor material so to have a desired structure and heating to melt the mixture;

a step of solidifying the heated and melted mixture of the respective elements to form an ingot material for the thermoelectric semiconductor material;

a step of pulverizing the ingot material to form powder of the ingot material;

a step of classifying the powder of the ingot material to a predetermined particle diameter or below; and a step of synthesizing a compound having a uniform structure and also forming a sintered body of the compound by applying a pulsed current and a pressure to the powder of the ingot material having the predetermined particle diameter or below to cause an electrical discharge among particles of the powder.

A method of producing a thermoelectric semiconductor material according to a fourteenth aspect of the invention comprises:

a step of heating to melt at least two kinds of elements or alloys as raw materials for the thermoelectric semiconductor material;

a step of solidifying the respective heated and melted elements or alloys to form ingot materials of the respective elements or alloys;

a step of pulverizing the ingot materials of the respective elements or alloys to form powder of the ingot materials of the respective elements or alloys;

a step of classifying the powder of the ingot materials of the respective elements or alloys to a predetermined particle diameter or below;

a step of mixing the powder of the ingot materials of the respective elements or alloys having the predetermined particle diameter or below so to have a desired composition; and a step of synthesizing a new kind of compound different from the at least two kinds of elements or alloys and also forming a sintered body of the new compound by applying a pulsed current and a pressure to the mixture of the powders of the ingot materials of the respectiv[0085] elements or alloys to cause an electrical discharges among particles of the powder to synthesize.

A method of producing a thermoelectric semiconductor material according to a fifteenth aspect of the invention comprises:
- a step of pulverizing respective ingots of at least two kinds of elements as raw materials for the thermoelectric semiconductor material to form powder of the each element;
- a step of classifying the powder of the each element to a predetermined particle diameter or below;
- a step of mixing the powders of the respective elements having the predetermined particle diameter or below so to have a predetermined composition; and
- a step of synthesizing a compound having a uniform structure and also forming a sintered body of the compound by applying a pulsed current and a pressure to the mixture of the powders of the respective elements to cause an electrical discharge among particles of the powder to synthesize.

Specifically, as shown in FIG. 3, the present invention uses spark plasma sintering device 10 to apply a pulsed current through powdered material 14. Thus, the electrical discharge is caused among particles of the powder to m synthesize compound $PbBi_2Te_4$ having a uniform structure.

More specifically, the electrical discharge is caused among the particles of the powder when the pulsed current is applied through the powdered material 14. The powder is heated owing to its own heating action resulting from the electrical discharge caused among the particles of the powder. At this time, the particles of the powder have a state of plasma among them and locally hot portions by the electrical discharge. Thus, a reaction is promoted. Defects are also caused in the crystal due to the impact of the electrical discharge, and the diffusion of atoms is promoted through the defects. Thus, the compound has a very uniform structure owing to the promoted reaction among the particles of the powder and the promoted diffusion of atoms.

The compound may be synthesized and sintered simultaneously by applying the pulsed current and a pressure to the powdered material 14 at the same time. But, it is not essential to solidify the powdered material 14 at the same time. As a procedure of the steps, the pulsed current may be applied through the powdered material 14 before applying a pressure to it. And, the powdered material 14 may be pressed before applying the pulsed current.

Here, the powdered material 14 to which the pulsed current is applied according to the invention includes the following.
(1) Mixture of at least two kinds of powdered compounds (e.g., a PbTe compound and a $Bi_2Te_3$ compound).
(2) Mixture of at least two kinds of powdered elements (e.g., Pb, Bi and Te).
(3) Powder prepared by mixing elements (e.g., Pb, Bi and Te), heating to melt the mixture, solidifying the melted mixture of the elements and pulverizing the produced ingot material.
(4) Mixture prepared by heating to melt respective compounds (e.g., a PbTe compound and a $Bi_2Te_3$ compound), solidifying the respective thermally melted compounds, forming the ingot material of each compound, pulverizing the ingot material of the each compound to prepare powder from the ingot material of the each compound, and mixing the respective powdered ingots of the compounds.
(5) Mixture prepared by pulverizing each ingot of at least two kinds of elements (e.g., Co and Sb) to form powder of each element and mixing the respective powdered elements.

BRIEF DESCRIPTION OF THE DRAWINGS

FIG. 1 is a table showing components, sintering conditions and crystalline structures of respective embodiments;

FIG. 2 is a table showing components, conduction types and thermoelectric properties of respective embodiments;

FIG. 4 is a table showing publication data about lattice spacing of $PbBi_2Te_4$;

FIG. 5 is a table showing publication data about lattice spacing of $Bi_1Te_1$;

FIG. 11 is a table showing synthesis examples of compounds other than synthesis examples 1, 2 and 3;

FIG. 15 is a table showing components, sintering conditions and crystalline structures related to Embodiments 101 to 131; and FIG. 16 is a table showing components, conduction types and thermoelectric properties related to Embodiments 101 to 131.

DETAILED DESCRIPTION OF THE PREFERRED EMBODIMENTS

Figure 3:
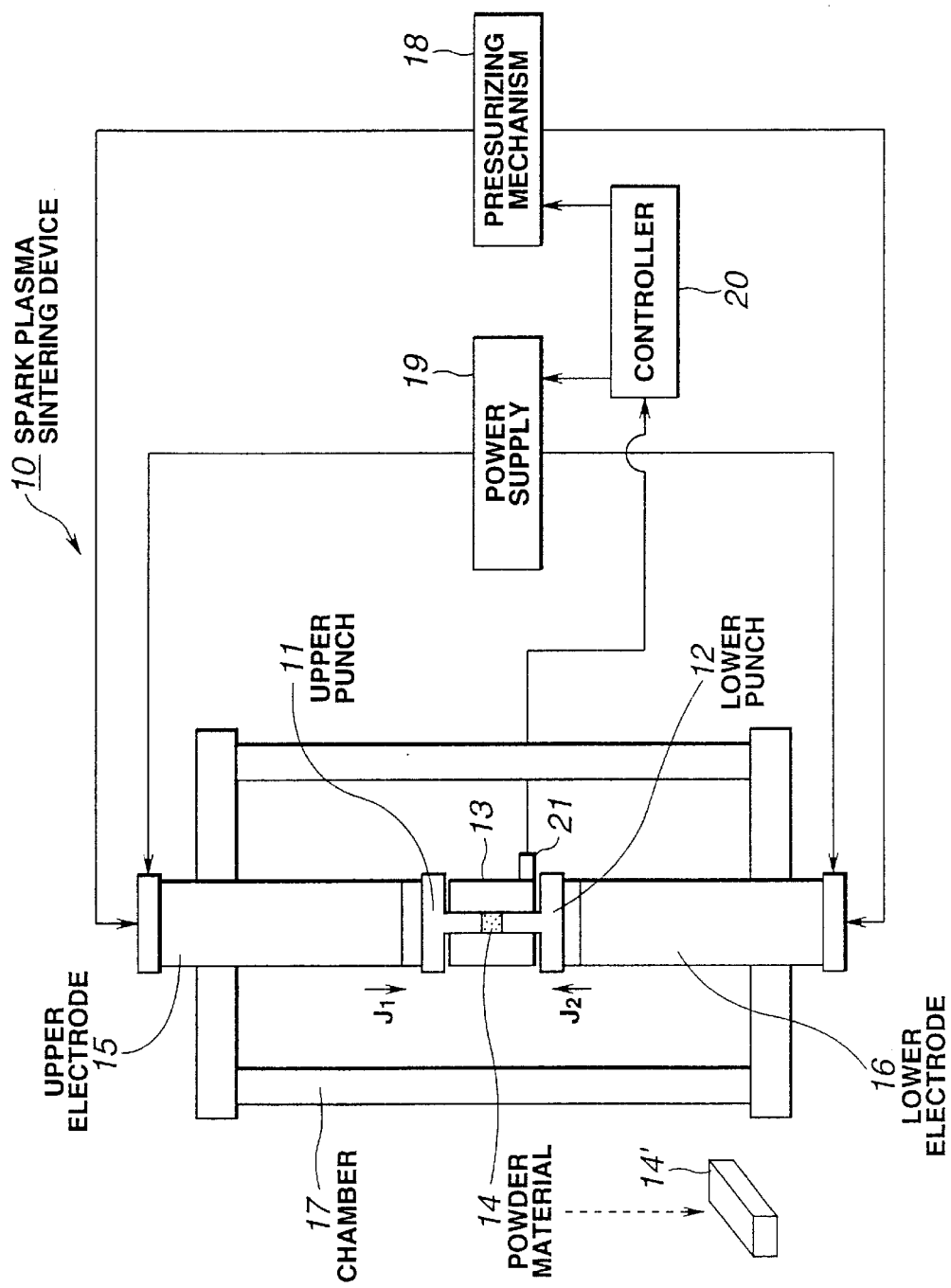
FIG. 3 is diagram showing a spark plasma sintering device of an embodiment.

Embodiments of the present invention will be described in detail with reference to the accompanying drawings.

First, as a thermoelectric semiconductor material, production of a thermoelectric semiconductor material expressed by chemical formula $AB_2X_4$ (A is a simple substance or mixture of Pb, Sn and Ge (IV family elements); B is a simple substance or mixture of Bi and Sb (V family elements); and X is a simple substance or mixture of Te and Se (VI family elements)) will be considered.

A synthesizing method for producing compound $PbBiTe_4$ will be described. But, it is to be understood that the present invention can be applied to the production of a compound having any composition if the thermoelectric semiconductor material is represented by the chemical formula $AB_2X_4$.

The compound $PbBi_2Te_4$ is a compound having compound PbTe and compound $Bi_2Te_3$ mixed at a stoichiometric ratio of 1:1. But, when a conventional melting and solidifying method is used to synthesize it, a compound having a uniform structure cannot be obtained. The melting and solidifying method is a method to synthesize a compound by sealing material elements into a glass tube to melt them, synthesizing in a liquid phase and cooling to solidify.

In this embodiment, the compound $PbBi_2Te_4$ is uniformly synthesized as follows.

Embodiment 1

(Heating Step)

First, elements lead Pb, bismuth Bi and tellurium Te as raw materials for a thermoelectric semiconductor material were weighed so to fall in a stoichiometric ratio of 1:2:4 ($PbBi_2Te_4$) and mixed. A compound for adjusting a carrier concentration may be added in an appropriate amount.

Then, the raw material mixture for the thermoelectric semiconductor material was sealed into a quartz ampoule under decompression and heated to melt.

(Solidifying Step)

Then, the melted raw material mixture was stirred for a fixed period and cooled to solidify in one direction to form an ingot material.

At this time, the ingot has a compound with excessive Pb and a compound with excessive Bi coexisted, and a uniform $PbBi_2Te_4$ compound cannot be obtained.

(Pulverizing Step)

Then, the ingot was pulverized by a stamp mill, a ball mill or the like in an inert atmosphere (e.g., nitrogen) to form powder of the ingot material.

(Classifying Step)

The powdered ingot material was sieved to classify to a particle diameter of 125 μm or below.

(Synthesizing Step)

A pulsed current was applied through the powdered material 14 (hereinafter called the powder material 14) by using spark plasma sintering device 10 to cause an electrical discharge among the particles of the powder to synthesize compound $PbBi_2Te_4$ with a uniform structure. And sintered body 14' of the compound $PbBi_2Te_4$ was also formed.

The spark plasma sintering device 10 comprises die 13 for forming the powder material 14 for the thermoelectric semiconductor material into a predetermined shape (e.g., rectangular parallelepiped), upper punch 11, lower punch 12, pressurizing mechanism 18 for applying compressive forces J1, J2 to the powder material 14 through the upper punch 11 and the lower punch 12, upper electrode 15 which is integral with the upper punch 11, lower electrode 16 which is integral with the lower punch 12, power supply 19 which applies a pulsed current to the powder material 14 by applying a DC pulse voltage to between the upper electrode 15 and the lower electrode 16, chamber 17 which keeps the powder material 14 in an argon gas atmosphere and in a vacuum, and controller 20 for controlling the pressurizing mechanism 18 and the power supply 19.

The pressurizing mechanism 18 mainly comprises, for example, a hydraulic actuator, and applies downward (in the drawing) compression J1 to the upper punch 11 and also upward (in the drawing) compression J2 to the lower punch 12.

The die 13 is a metal mold for surrounding the periphery of the powder material 14. The powder material 14 is charged into the die 13, and a peripheral shape of the powder material 14 is formed. The die 13 is provided with temperature sensor 21 (e.g., a thermocouple) for detecting a temperature of the powder material 14. The controller 20 controls the power supply 19 according to a detection temperature by the temperature sensor 21 used as a feedback signal so to determine a temperature of the powder material 14 to a desired heating temperature.

The upper punch 11 is a metal mold to be contacted to the top surface of the powder material 14. When the upper punch 11 is inserted into the die 13 from above, the leading end face of the punch 11 comes in contact with the top surface of the powder material 14 to form the upper surface shape of the powder material 14.

The lower punch 12 is a metal mold which is contacted to the lower surface of the powder material 14. When the lower punch 12 is inserted into the die 13 from below, the leading end surface of the punch 12 comes in contact with the lower surface of the powder material 14 to form the lower surface shape of the powder material 14.

Now, production of rectangular sintered body 14' from the powered material 14 by operating the spark plasma sintering device 10 will be described.

First, the powder material 14 for the thermoelectric semiconductor material which was pulverized and classified in the pulverizing step and the classifying step, is charged into the metal molds 11, 12, 13 of the spark plasma sintering device 10.

Then, the controller 20 outputs a pressure control signal to the pressurizing mechanism 18 so to apply a pressure of 400 $kgf/cm^2$ to the powder material 14. As a result, the upper punch 11 is lowered while the lower punch 12 is raised to apply a pressure of 400 $kgf/cm^2$ to the powder material 14. Thus, the powder material 14 is solidified into a rectangular shape.

The controller 20 also outputs a pulse control signal to the power supply 19 so to heat the powder material 14 at a temperature of 500° C. As a result, a DC pulse voltage of a predetermined interval is applied to between the upper electrode 15 and the lower electrode 16 to apply a DC pulsed current of a predetermined interval to the powder material 14, and the powder material 14 is heated at a temperature of 500° C.

Specifically, the pulsed current is applied through the powder material 14 to cause an electrical discharge among the particles of the powder. The powder is heated by its own heating action owing to the electrical discharge caused among the particles of the powder. At this time, a plasma state is formed among the particles of the powder by the electrical discharge to locally form high-temperature portions. Thus, the reaction is promoted. Defects are also caused in the crystal due to the impact of the electrical discharge, and the diffusion of atoms is promoted through the defects. The compound is provided with a very uniform structure owing to the promoted reaction among the particles of the powder and the promoted diffusion of atoms.

As described above, the powder material 14 was sintered under conditions of a temperature of 500° C. and a pressure of 400 $kgf/cm^2$ for two hours.

As a result, the compound was synthesized and sintered at the same time to form the sintered body 14' of the compound $PbBi_2Te_4$ having a very uniform structure.

Figure 6:
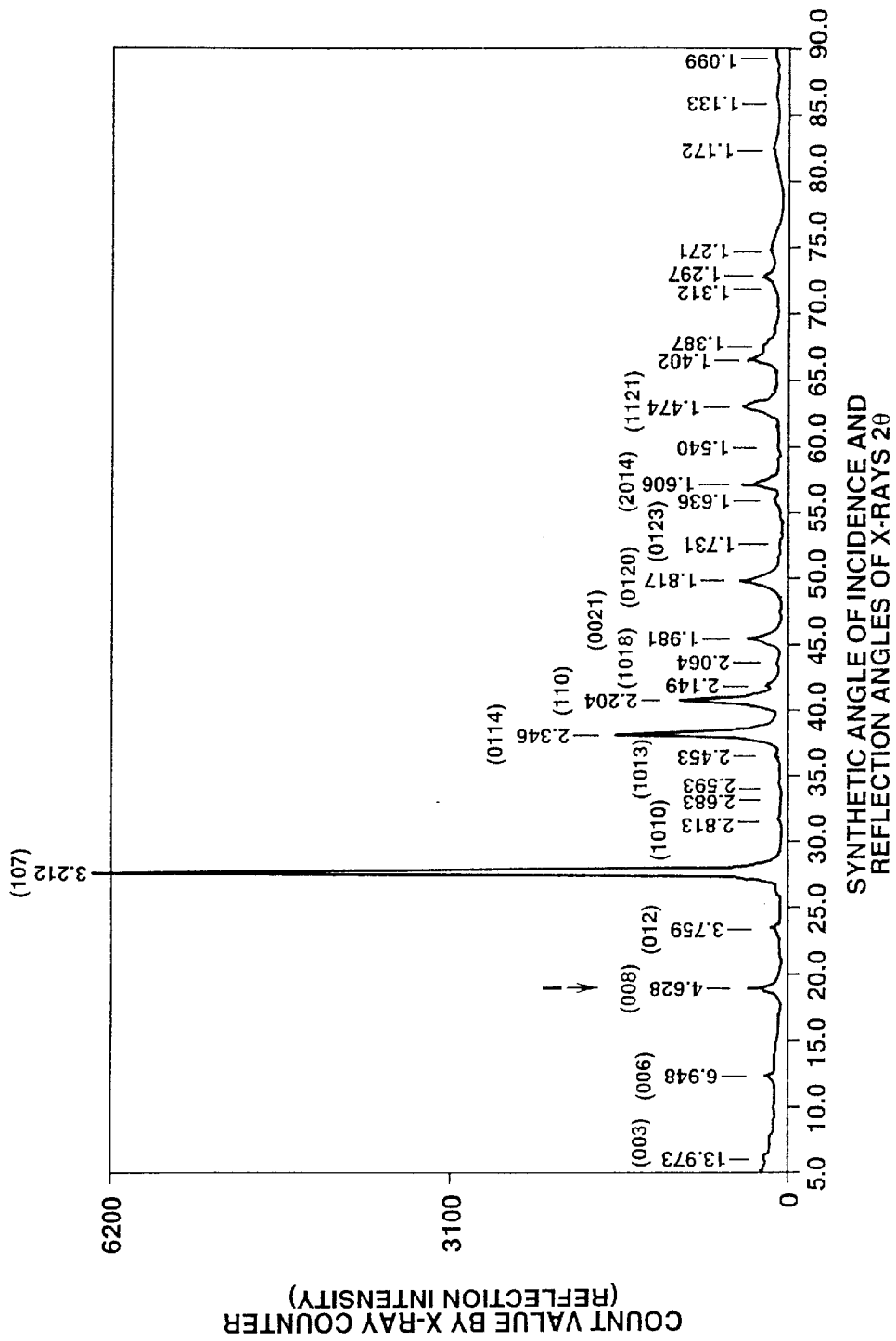
FIG. 6 is a diagram showing measured results of X-ray reflection intensity of $PbBi_2Te_4$.

FIG. 6 shows results of analyzing the crystalline structure (composition) of the compound, which was obtained by the spark plasma method, by an X-ray diffraction method.

The horizontal axis of the graph shown in FIG. 6 indicates angle. 2θ synthesizing an incidence angle and a reflection angle of X-rays, and the vertical axis indicates a count value (reflection intensity) of an X-ray counter.

Lattice spacing (A) is determined from the synthetic angle 2θ. According to the publication data shown in FIG. 4, the crystalline structure of the compound $PbBi_2Te_4$ shows lattice spacing d=4.61(A) with index of the plane (h, k, 1)=(0, 0, 9).

It is seen from FIG. 6 that peak d=4.628 corresponding to theoretical value 4.61 was observed as indicated by arrow I. Namely, a peak indicating a crystalline structure other than the target one was not observed. It was found from the results of the X-ray analysis that uniform compound $PbBi_2Te_4$ having the same structure as target Rucklidgeite mineral (structural formula: $(Pb, Bi)_3Te_4$) was synthesized.

FIG. 1 shows the sintering conditions for producing the sintered body 14' of the component $PbBi_2Te_4$ in Embodiment 1 and kinds of crystalline structures of the sintered body 14' produced.

Figure 8:
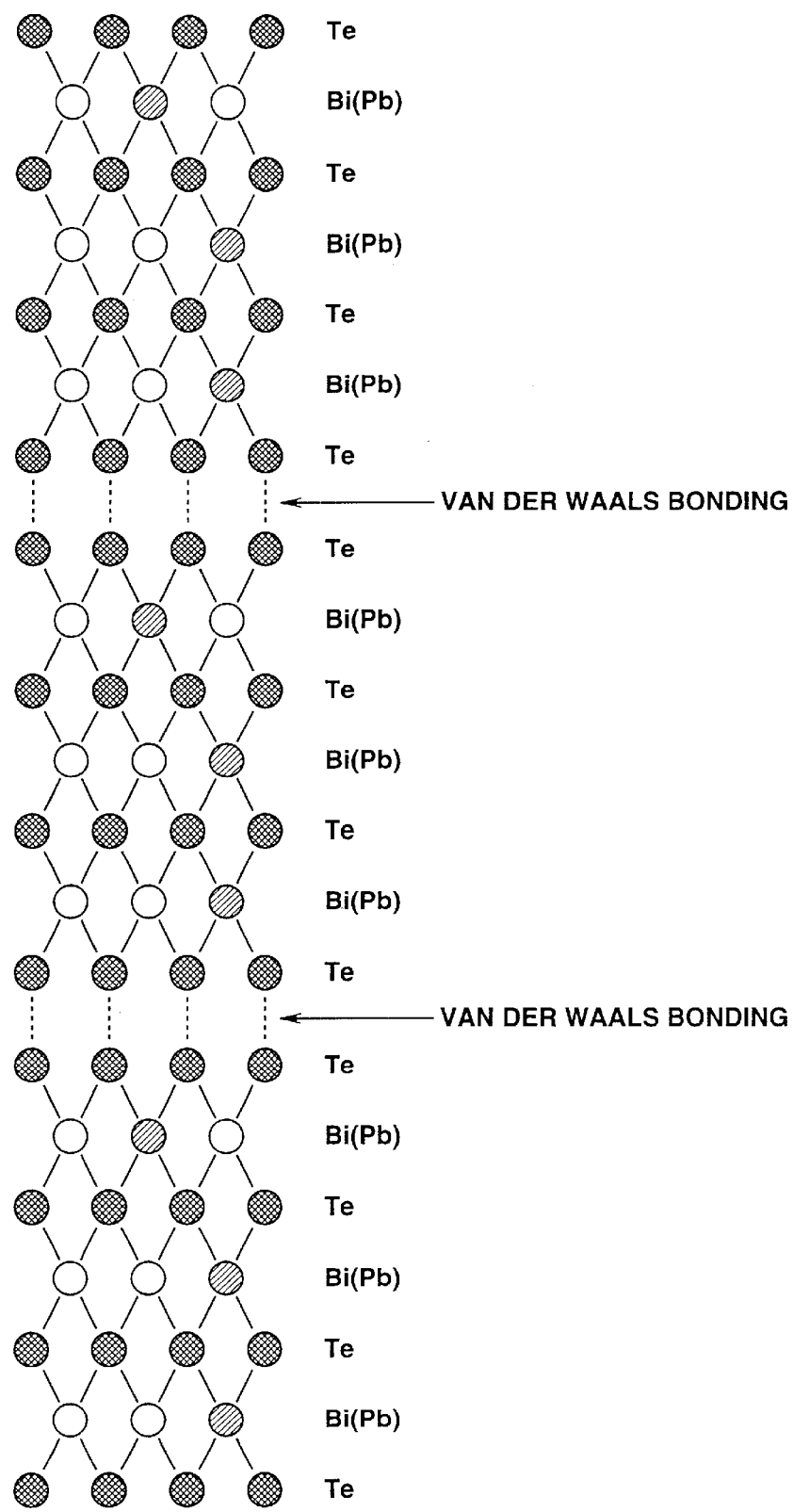
FIG. 8 is a diagram schematically showing Rucklidgeite structure.

The crystalline structure obtained is shown in FIG. 8. Specifically, Te, Bi, Te, Bi, Te, Bi and Te are sequentially bonded from top to bottom into seven layers by the covalent bonding. And, three groups of these seven layers are bonded by Van der Waals bonding or ionic bonding to form a total of 21 layers as one unit, to form a layered crystalline structure of a uniform phase.

A conduction type of the sintered body 14' of the composition $PbBi_2Te_4$ obtained in Embodiment 1 was n type, and this n-type thermoelectric semiconductor material was measured for its thermoelectric property.

As a result, as shown in FIG. 2, power factor ($\times 10^{-5}$ W/cmK$^2$) was 1.8, thermal conductivity κ (mW/Kcm) was 20, and figure of merit Z ($\times 10^{-3}$/K) at a temperature of 500 K was 0.9. These figures were compared with those of a conventional n-type PbTe based semiconductor material (Comparative Example 1) to find that the power factor is same (1.8), the thermal conductivity κ is lower (20 against 25), the figure of merit Z is higher (0.9 against 0.7), and the thermoelectric property is more excellent than the conventional PbTe based semiconductor material. The power factor is a value obtained by dividing the square of the Seebeck coefficient α ($\mu$V/K) by electrical resistivity ρ ($\mu\Omega$·cm), and the larger this value becomes, the better the thermoelectric performance is.

As described above, according to Embodiment 1, a Rucklidgeite layer structure with a uniform phase is obtained as shown in FIG. 8. Even when sintered, the thermoelectric property can be kept at a high value, namely thermal conductivity κ is low and the figure of merit Z is high, as compared with the conventional PbTe based semiconductor material.

Embodiment 14

Now, production of a thermoelectric semiconductor material represented by chemical formula $Bi_{1-x}Sb_xTe_1$ (where, $0 \leq x \leq 1$) will be described.

A synthesizing method of a compound BiTe (x=0) will be described. It is to be understood that the present invention can be applied to the production of a compound having any composition if the thermoelectric semiconductor material is represented by the chemical formula $Bi_{1-x}Sb_xTe_1$.

This compound BiTe was also produced in the same way as in Embodiment 1 through the heating step, the solidifying step, the pulverizing step, the classifying step and the synthesizing step.

But, the powder material 14 was sintered by the spark plasma sintering device 10 under conditions of a temperature of 450° C. and a pressure of 400 kgf/cm$^2$ for two hours.

As a result, the compound was synthesized and sintered at the same time to form the sintered body 14' of the compound BiTe with a very uniform structure.

Figure 7:
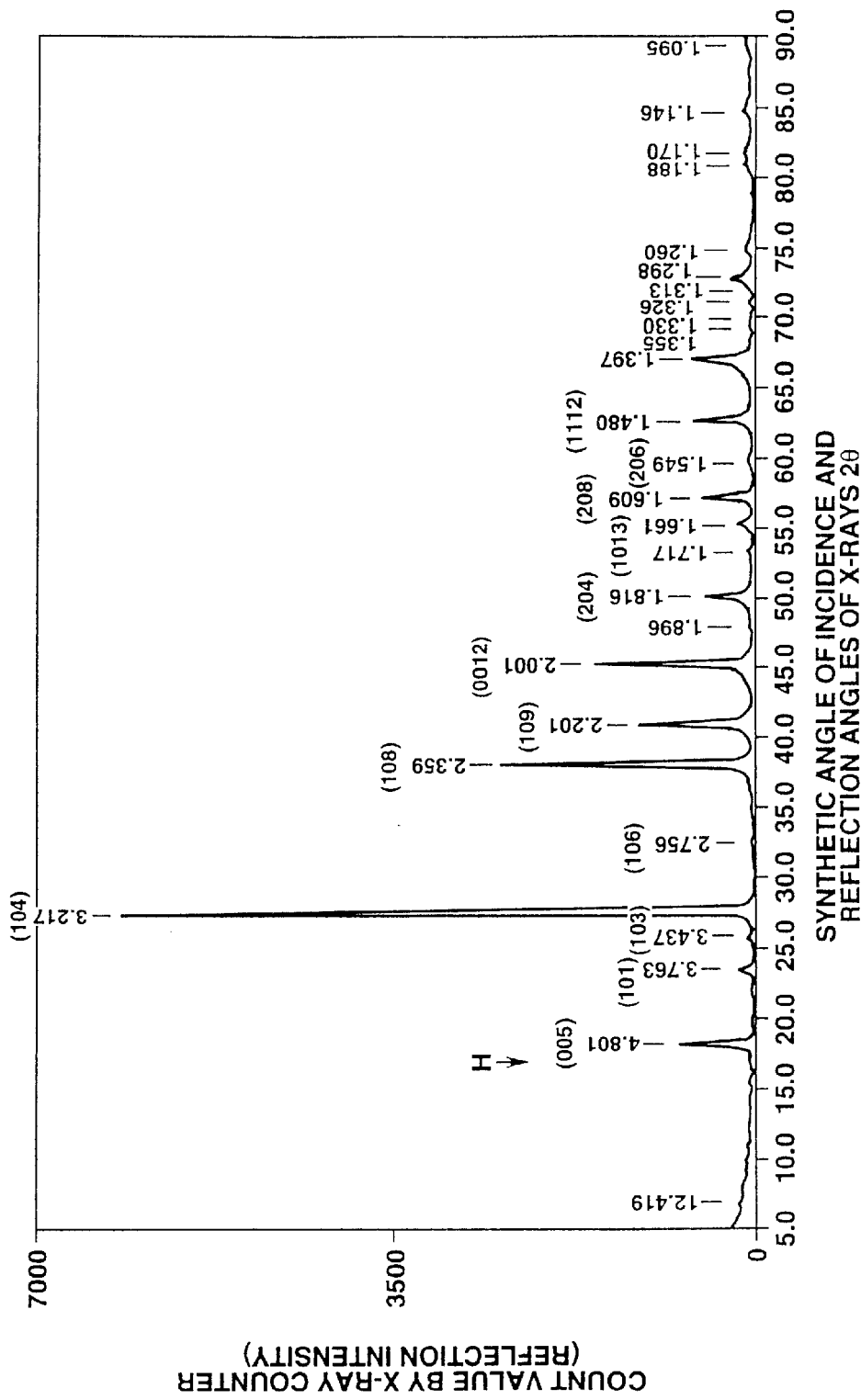
FIG. 7 is a diagram showing measured results of X-ray reflection intensity of $Bi_1Te_1$.

FIG. 7 shows results obtained by analyzing a crystalline structure (composition) of the compound BiTe, which was obtained by the spark plasma method, by the X-ray diffraction method.

Similar to FIG. 6, the horizontal axis of the graph in FIG. 7 indicates angle 2θ synthesizing the incidence angle and the reflection angle of X-rays, and the vertical axis indicates a count value (reflection intensity) of the X-ray counter. Lattice spacing d (A) is determined from the synthetic angle 2θ. According to the publication data shown in FIG. 5, the crystalline structure of the compound BiTe shows lattice spacing d=4.808(A) with index of the plane (h, k, 1)=(0, 0, 5).

According to FIG. 7, a peak of d=4.801 corresponding to a theoretical value 4.808 was observed as indicated by arrow H. Namely, a peak indicating a crystalline structure other than the target one was not observed. Thus, it was found from the results of the X-ray analysis that a uniform compound BiTe having the same structure as a target Tsumoite mineral (structural formula: BiTe) was synthesized.

Sintering conditions for producing the sintered body 14' of the composition BiTe in Embodiment 14 and kinds of crystalline structures of the produced sintered body 14' are collectively shown in FIG. 1.

Figure 9:
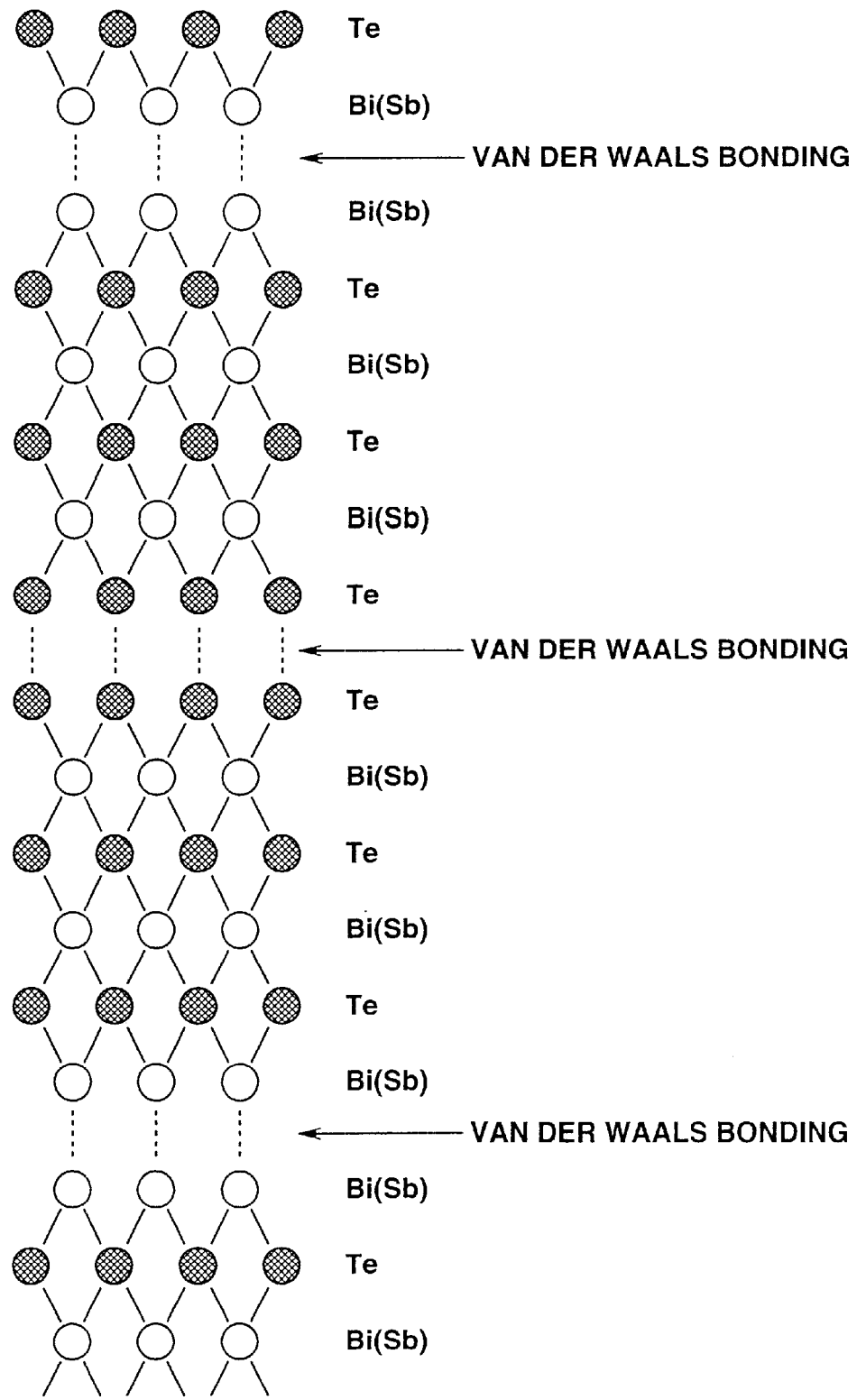
FIG. 9 is a diagram schematically showing Tsumoite structure.
Figure 10:
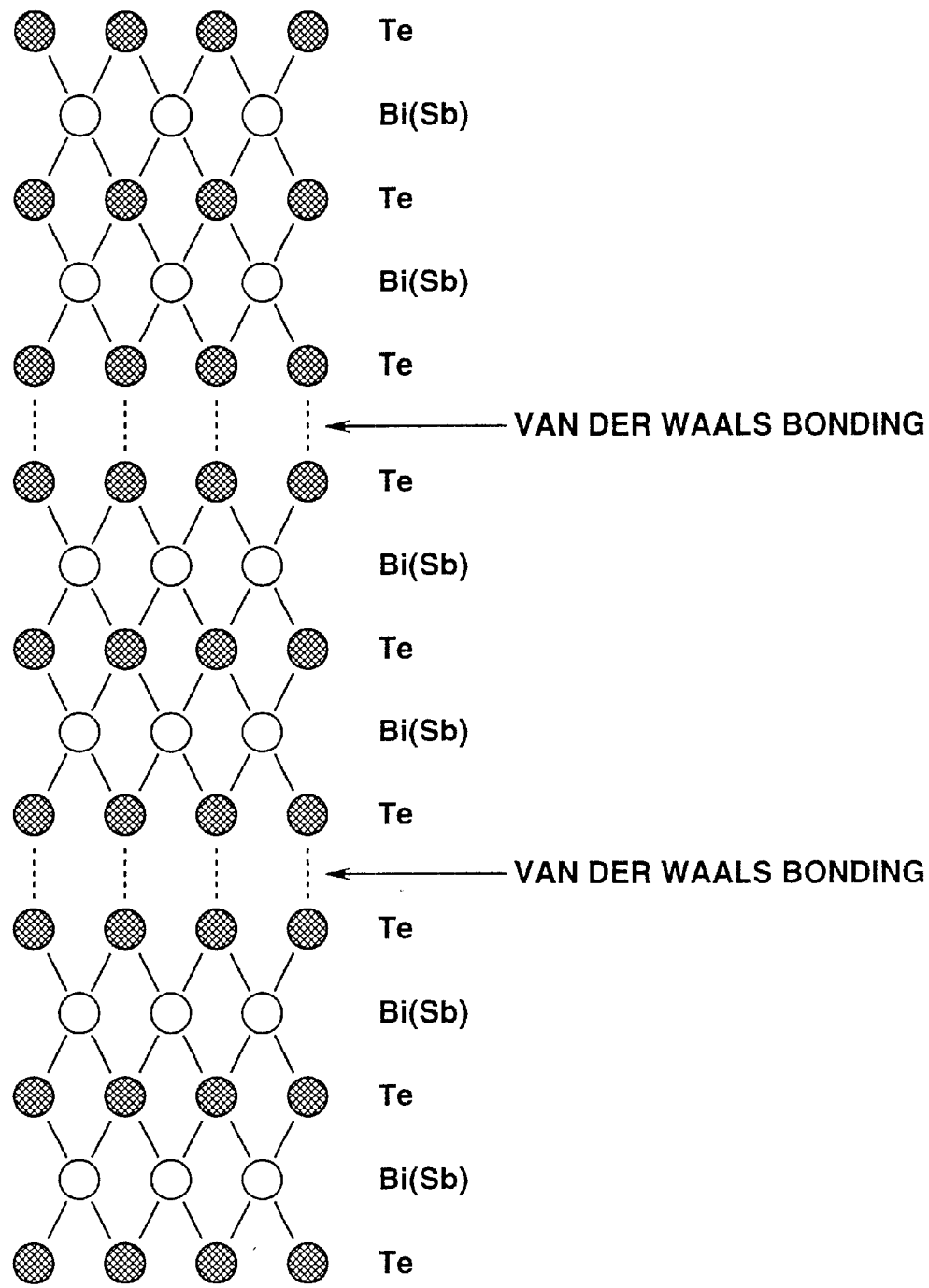
FIG. 10 is a diagram schematically showing $Bi_2Te_3$ structure.

The crystalline structure obtained is shown in FIG. 9. Specifically, Bi, Te, Bi, Te, Bi and Te are sequentially bonded from top to bottom into six layers by the covalent bonding. And, another group of six layers also has Te, Bi, Te, Bi, Te and Bi bonded from top to bottom into six layers by the covalent bonding. Two groups of these six layers are bonded by Van der Waals binding or ionic bonding to form a total of 12 layers as one unit, to form a layered crystalline structure with a uniform phase.

A conduction type of the sintered body 14' of the composition BiTe obtained in Embodiment 14 is n type, and this n-type thermoelectric semiconductor material was measured for its thermoelectric property.

As a result, power factor $\times 10^{-5}$ W/cmK$^2$) was 1.8, thermal conductivity κ (mW/Kcm) was 31, and figure of merit Z ($\times 10^{-3}$/K) at a temperature of 500 K was 0.6. These figures were not inferior in view of thermoelectric property as compared with those of a conventional n-type PbTe based semiconductor material (Comparative Example 1).

Embodiment 21

Now, as a thermoelectric semiconductor material, production of a thermoelectric semiconductor material expressed by chemical formula $A_yB_{1-y}X_1$ (where, $0 \leq y \leq 0.25$, A is a simple substance or mixture of Pb, Sn and Ge (IV family elements); B is a simple substance or mixture of Bi and Sb (V family elements); X is a simple substance or mixture of Te and Se (VI family elements)) will be described.

A synthesizing method for producing compound $Ge_{0.1}Bi_{0.9}Te$ will be described. But, it is to be understood that the present invention can be applied to the production of a compound having any composition if it is a thermoelectric semiconductor material represented by the chemical formula $A_yB_{1-y}X_1$.

This compound $Ge_{0.1}Bi_{0.9}Te$ was also produced in the same way as in Embodiment 1 through the heating step, the solidifying step, the pulverizing step, the classifying step and the synthesizing step.

But, the powder material 14 was sintered by the spark plasma sintering device 10 under conditions of a temperature of 450° C. and a pressure of 400 kgf/cm$^2$ for two hours.

As a result, the compound was synthesized and sintered at the same time to form the sintered body 14' of the compound $Ge_{0.1}Bi_{0.9}Te$ with a very uniform structure.

Sintering conditions for producing the sintered body 14' of the composition $Ge_{0.1}Bi_{0.9}Te$ in Embodiment 21 and kinds of crystalline structures of the produced sintered body 14' are collectively shown in FIG. 1.

The crystalline structure obtained has Tsumoite structure as shown in FIG. 9. But, 10% of Bi in the crystalline structure shown in FIG. 9 is replaced by Ge of IV family elements.

A conduction type of the sintered body 14' of the composition $Ge_{0.1}Bi_{0.9}Te$ obtained in Embodiment 21 was n type, and this n-type thermoelectric semiconductor material was measured for its thermoelectric property.

As a result, as shown in FIG. 2, power factor ($\times 10^{-5}$ W/cmK$^2$) was 1.8, thermal conductivity κ (mW/Kcm) was 20, and figure of merit Z ($\times 10^{-3}$/K) at a temperature of 500 K was 0.9. These figures are compared with those of a conventional n-type PbTe based semiconductor material (Comparative Example 1) to find that the power factor is same (1.8), the thermal conductivity κ is lower (20 against 25), the figure of merit Z is higher (0.9 against 0.7), and the thermoelectric property is more excellent than the conventional PbTe based semiconductor material.

As described above, according to Embodiment 21, Tsumoite layered structure with a uniform phase is obtained as shown in FIG. 9. Even when sintered, the thermoelectric property can be kept at a high value, namely thermal conductivity κ is low and the figure of merit Z is high, as compared with the conventional PbTe based semiconductor material.

Embodiments 2 to 13 relating to the production of compounds represented by the aforesaid chemical formula $AB_2X_4$ will be described to show a tendency of a change in its thermoelectric property.

FIG. 1 shows the "compositions" of the chemical formula $AB_2X_4$, "sintering conditions" and "crystalline structures" of the produced sintered body 14' of respective Embodiments 1 through 13.

The same uniform compound with the Rucklidgeite structure as in Embodiment 1 was synthesized in all Embodiments 2 through 13.

FIG. 2 shows the "conduction type", "power factor" ($\times 10^{-5}$W/cmK$^2$), "thermal conductivity κ" (mW/Kcm) and "figure of merit Z at 500 K" ($\times 10^{-3}$/K) determined for the sintered body 14' in each of Embodiments 1 through 13.

As "Comparative Example 1" of the n-type, the thermoelectric property of PbTe as the PbTe-based thermoelectric semiconductor material is shown. This compound PbTe was produced by sintering under conditions of a temperature of 550° C., a pressure of 400 kgf/cm$^2$ for ten minutes. Impurity $PbI_2$ was added in 0.5 wt % as dopant. As "Comparative Example 2" of the p-type, the thermoelectric property of $Pb_{0.75}Sn_{0.25}Te$ as PbSnTe-based thermoelectric semiconductor material is shown. This compound $Pb_{0.75}Sn_{0.25}Te$ was produced by sintering under conditions of a temperature of 500° C. and a pressure of 400 kgf/cm for 10 minutes.

Embodiment 2 through Embodiment 5 have compositions prepared by replacing Pb element in $PbBi_2Te_4$ of Embodiment 1 with tin Sn or germanium Ge which is the same IV family element or Bi element with antimony Sb of the same V family element.

Embodiment 1 through Embodiment 5 have the same power factor as Comparative Examples 1, 2 but lower thermal conductivity κ than Comparative Examples 1, 2 because Embodiments 1 to 5 have a layered structure, higher figure of merit Z and superior thermoelectric property than Comparative Examples 1, 2.

When lead Pb is replaced by tin Sn or germanium Ge, there is a tendency that thermal conductivity κ is lowered and figure of merit Z is increased. One of these reasons is considered that a crystalline lattice is deformed because Sn or Ge having a smaller atomic radius is in an atomic position where Pb should exist, and thermal conductivity is lowered by lattice vibration. There is also a tendency that conduction of the p-type appears owing to the inclusion of tin Sn or antimony Sb.

Embodiment 6 through Embodiment 9 have a part of lead Pb in $PbBi_2Te_4$ of Embodiment 1 replaced by tin Sn of the same IV family element and a ratio of tin Sn varied in a range of 25% to 90%.

Embodiment 6 through Embodiment 9 also have lower thermal conductivity κ than Comparative Examples 1, 2 because Embodiments 6 to 9 have a layered structure, higher figure of merit Z and superior thermoelectric property than Comparative Examples 1, 2.

By replacing a part of lead Pb by tin Sn, there is a tendency that thermal conductivity κ is further lowered and figure of merit Z is increased. Reasons are the same as above.

When a ratio of tin Sn is set to 80% or more, it was found that the n-type is. changed to the p-type.

Embodiments 10, 11 have a part of tellurium Te in $PbBi_2Te_4$ of Embodiment 1 replaced by selenium Se of the same VI family element and have a stoichiometric ratio of tellurium Te and selenium Se to 3.7:0.3. Embodiment 11 has lead Pb replaced by tin Sn.

Embodiments 10, 11 also have a layered structure, lower thermal conductivity κ than Comparative Examples 1, 2, higher figure of merit Z than Comparative Examples 1, 2 and superior thermoelectric property.

By replacing a part of tellurium Te with selenium Se, there is a tendency that thermal conductivity κ is further lowered and figure of merit Z is further increased as compared with Embodiments 1, 2.

Embodiments 12, 13 have a part of bismuth Bi of $PbBi_2Te_4$ of Embodiment 1 replaced by antimony Sb of the same V family element and a stoichiometric ratio of bismuth Bi and antimony Sb set to 0.5:1.5. Embodiment 13 has a composition with lead Pb replaced by tin Sn.

Embodiments 12, 13 also have a layered structure and lower thermal conductivity κ, higher figure of merit Z and superior thermoelectric property than Comparative Examples 1, 2.

Embodiments 12, 13 indicate p-type conduction and it was found that the conduction type is readily changed to the p-type by replacement of a part of bismuth Bi with antimony Sb.

In addition to Embodiment 14 described above, a tendency of a change in thermoelectric property will be described in Embodiments 15 through 20 for producing compounds represented by the aforesaid chemical formula $Bi_{1-x}Sb_xTe_1$ (where, $0 \leq x \leq 1$).

In Embodiment 15 through Embodiment 20, compounds having the same uniform Tsumoite structure as in Embodiment 14 were synthesized.

In Embodiment 14 through Embodiment 20, a part of bismuth Bi of $Bi_1Te_1$ of Embodiment 14 was replaced by antimony Sb of the same V family element, and a ratio of antimony Sb was varied from 0% to 100% in increments of 10%. In other words, x in the chemical formula $Bi_{1-x}Sb_xTe_1$ was changed from 0 to 1.0 in increments of 0.1.

Embodiments 14 to 20 have the same thermal conductivity κ as in Comparative Examples 1, 2 but higher power factor and higher figure of merit Z than Comparative Examples 1, 2 and superior thermoelectric property to Comparative Examples 1, 2 excluding some exceptions (Embodiment 17).

And, the n-type conduction is indicated until a ratio of antimony Sb becomes 50% (Embodiments 14, 15, 16, 16-2, 16-3 and 17), and the p-type conduction is indicated when it exceeds 50%.

Figure of merit Z is increased with an increase of a ratio of Sb until it increases to 50% (Embodiments 14, 15, 16-2 and 16-3), and when it exceeds 50% (Embodiments 17-2, 18, 19 and 19-2), the figure of merit Z tends to lower conversely with its increase.

In addition to Embodiment 21, a tendency of a change in thermoelectric property and a tendency of having a uniform crystalline structure will be described in Embodiments 22 through 32 for producing compounds represented by the aforesaid chemical formula $A_y B_{1-y} X_1$.

In Embodiments 22 through 32, compounds having the same uniform Tsumoite structure as in Embodiment 21 were synthesized excluding some exceptions (Embodiments 24, 28, 32) as described afterward.

In Embodiments 21 to 32, a part of bismuth Bi(V family element) of Tsumoite (BiTe) was replaced by germanium Ge, tin Sn or lead Pb of the IV family elements, and a ratio of replacing amount was varied in a range of from 10% to 30%. In other words, y in the chemical formula $A_y B_{1-y} X_1$ was changed in a range of from 0.1 to 0.3.

The uniform Tsumoite structure could be obtained until a substitution rate of bismuth Bi to the IV family element becomes 25% (y=0.25). But, when the substitution rate to the IV family element (antimony Sb or the like) exceeds 25% to reach 30%, the uniform Tsumoite structure cannot be obtained. In other words, Embodiments 24, 28 and 32 with the substitution rate of 30% had the Tsumoite structure and also another crystal of NaCl type. A reason for this is considered that the compound represented by the chemical formula $A_y B_{1-y} X_1$ is synthesized by intercrystallize GeTe, SnTe and PbTe having a rhombohedral structure of deformed NaCl type or NaCl type to BiTe having the Tsumoite type structure, so that there is a solid solution limit at a substitution rate of about 25%, and if it is higher than that, a uniform Tsumoite structure cannot be maintained.

FIG. 2 shows Embodiments (falling in a range of $0.1 \leq y \leq 0.25$) excluding Embodiments 24, 28, 32 which do not provide a uniform Tsumoite structure, and the measured results of their thermoelectric property.

Even when a part of bismuth Bi is replaced by any of germanium Ge, tin Sn or lead Pb of the IV family elements, the power factor is higher than in Comparative Examples 1, 2, the thermal conductivity κ is lower than in Comparative Examples 1, 2, the figure of merit Z is higher than in Comparative Examples 1, 2, and the thermoelectric property is superior to Comparative Examples 1, 2. It is assumed that atoms (n-type semiconductor carriers) are decreased to have a level close to an appropriate carrier concentration ($10^{-19}/cm^3$) by replacing the V family atom with the IV family atom. Besides, the V family bismuth atom Bi is replaced by a IV family atom, so that the thermal conductivity κ is lowered too. It is seen that a lowering rate of the thermal conductivity becomes large in order of atoms having a small atomic radius, namely it becomes larger in order of germanium Ge, tin Sn and lead Pb.

In these Embodiments, the spark plasma sintering device 10 is used to apply a pulsed current to and apply a pressure to the powder material 14 at the same time to synthesize and sinter the compound simultaneously, but it is not essential to solidify the powder material 14 at the same time.

As an order of the steps, a pressure may be applied after applying a pulsed current to the powder material 14. And, the pulsed current may be applied after applying a pressure to the powder material 14.

Thus, the thermoelectric semiconductor material is cut from the sintered body 14' of the compound synthesized by the embodiment described above into a shape according to a purpose of using the thermoelectric element. For example, when a doughnut shape is required for the purpose of using the thermoelectric element, a doughnut-shaped material is cut from the rectangular sintered body 14' and machined.

Embodiments 101 through 131

By the same method as described above, the powder material having the following composition was sintered by a spark plasma sintering machine at 500° C. for two hours, and the obtained sintered body was measured for its crystalline structure and thermoelectric property. FIG. 15 is a table showing the compositions, sintering conditions and crystalline structures related to Embodiments 101 to 131. FIG. 16 is a table showing the compositions, conduction types and thermoelectric properties related to Embodiments 101 to 131.

(1) Powder material represented by chemical formula $Bi_{1-x}Sb_xTe_{1-y}Se_y$ (where, $0 \leq x \leq 1$ and $0 \leq y \leq 1$) (Embodiments 101 to 116)

(2) Powder material represented by chemical formula $Bi_{1-x}Sb_xTe_{1-y}Se_y$ (where, $0 \leq x \leq 2$ and $0 \leq y \leq 1$) (Embodiments 117 to 123).

(3) Powder material represented by chemical formula $(Bi_{1-x}Sb_x)_4(Te_{1-y}Se_y)_5$ (where, $0 \leq x \leq 1$ and $0 \leq y \leq 1$) (Embodiments 124 to 131).

As a result of the aforesaid experiments, the compounds according to Embodiments 101 to 116 were confirmed to have the same layered structure as the Tsumoite mineral. In addition, the compounds according to Embodiments 101 to 131 were confirmed to have the figure of merit same to or higher than the PbTe- and PbSnTe-based thermoelectric semiconductor materials shown as Comparative Examples 1, 2 in FIG. 16.

Now, an embodiment of a method which can efficiently produce a compound usable as a thermoelectric semiconductor material with a uniform structure will be described in detail with reference to the drawings.

In this embodiment, a method for synthesizing a compound $PbBi_2Te_4$ as the thermoelectric semiconductor material will be described. It is to be understood that the present invention can be applied to a production of a compound having whatever composition when it is used as the thermoelectric semiconductor material.

Figure 12:
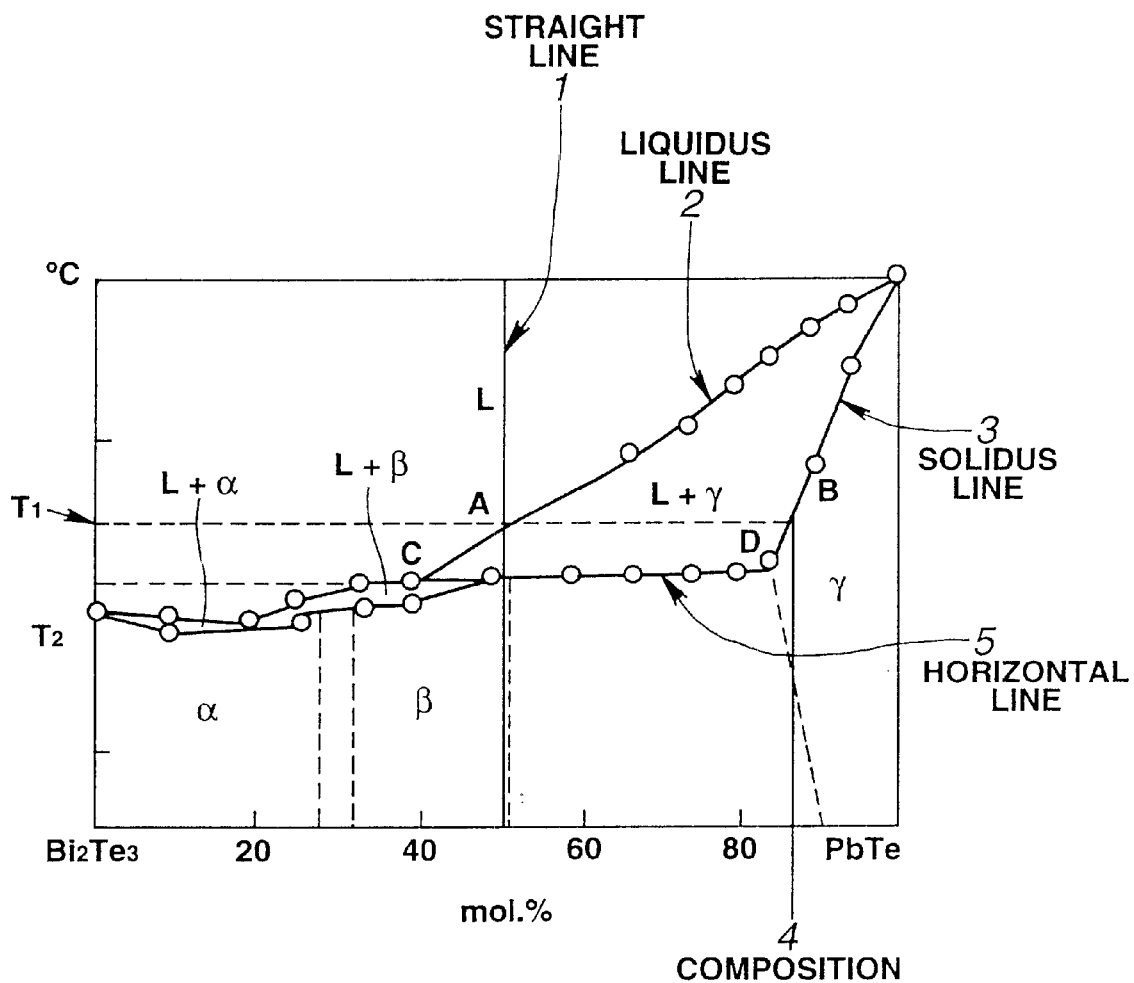
FIG. 12 is a phase diagram of $PbTe-Bi_2Te_3$ alloy.

As described above, the compound $PbBi_2Te_4$ is a compound prepared by mixing the compound PbTe and the compound $Bi_2Te_3$ in a stoichiometric ratio of 1:1. But, as apparent from the state diagram of FIG. 12 described above, it cannot be produced to have a uniform structure if synthesized by the conventional melting and solidifying method.

Figure 13:
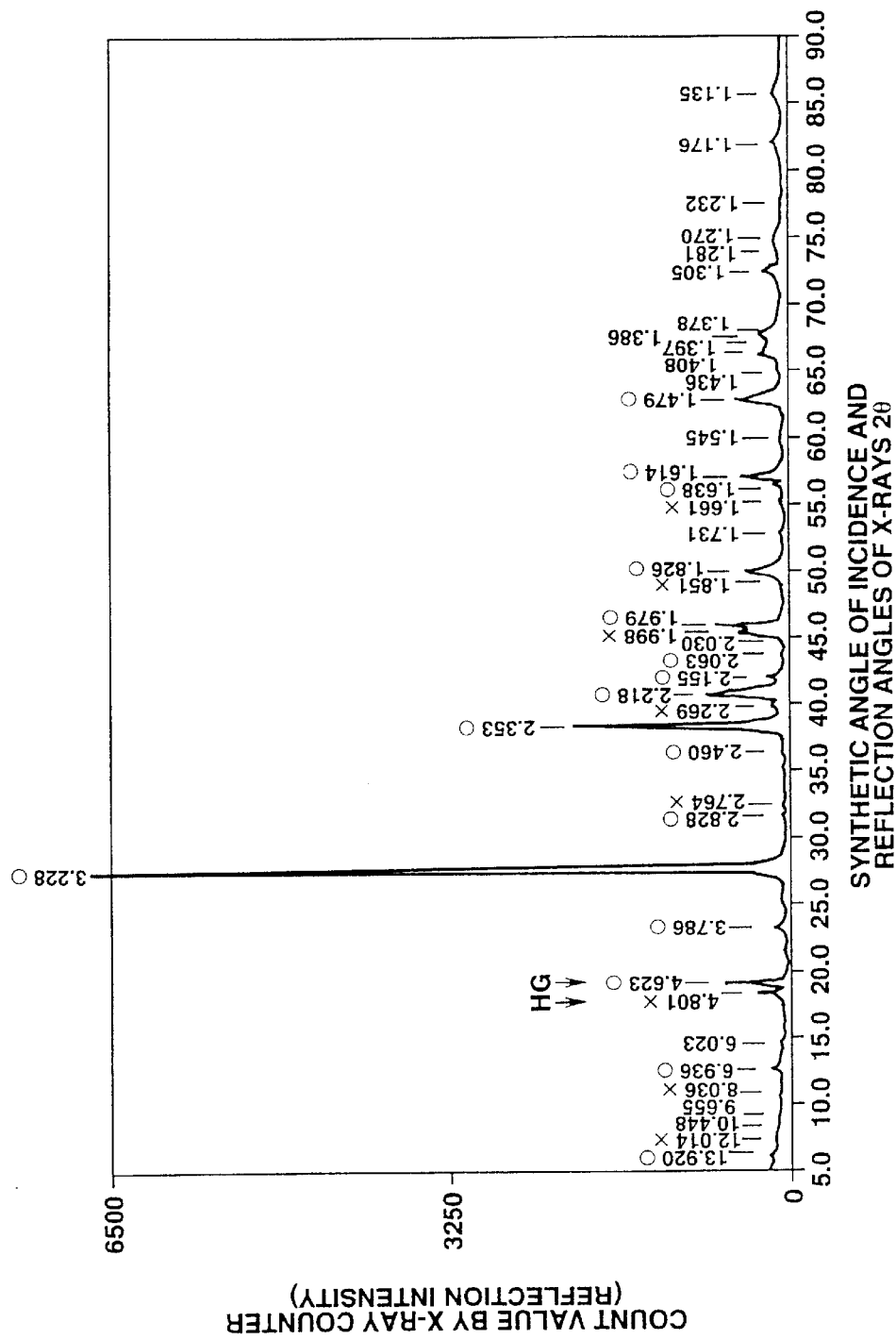
FIG. 13 is a diagram showing measured results of X-ray reflection intensity according to a conventional melting and solidifying method.

FIG. 13 shows the results of analyzing the crystalline structure (composition) of a compound obtained by the melting and solidifying method by the X-ray diffraction method.

The horizontal axis of FIG. 13 is angle 2θ having an incidence angle and a reflection angle of X-rays synthesized and the vertical axis indicates a count value (reflection intensity) of an X-ray counter. Lattice spacing d (angstrom) is obtained from the synthetic angle 2θ. According to publication data, the crystalline structure of compound $PbBi_2Te_4$ shows lattice spacing d=4.61 (angstrom) with index of the plane (h, k, 1)=(0, 0, 9).

According to FIG. 13, a peak of d=4.623 corresponding to a theoretical value 4.61 is observed as indicated by arrow G, but a peak of d=4.801 showing a crystalline structure other than the target one is observed in its vicinity as indicated by arrow H. Thus, it is seen from the results of the X-ray analysis that a composition (crystalline structure) different from the target $PbBi_2Te_4$ is produced.

In this embodiment, the compound $PbBi_2Te_4$ is uniformly synthesized as follows.

Synthesizing Example 1

(Heating Step)

First, lead Pb, bismuth Bi and tellurium Te as materials for the thermoelectric semiconductor material were weighed to have a stoichiometric ratio of 1:2:4 ($PbBi_2Te_4$) and mixed. A compound for adjusting a carrier concentration may be added.

Then, the material mixture for the thermoelectric semiconductor material was sealed into a glass tube under a vacuum and melted.

(Solidifying Step)

Then, the melted material mixture was solidified by solidifying in one direction to form an ingot material.

At this time, the ingot has a compound with excessive PbTe and a compound with excessive $Bi_2Te_3$ coexisted, and a uniform $PbBi_2Te_4$ compound cannot be obtained as indicated by the aforesaid X-ray diffraction data of FIG. 13.

(Pulverizing Step)

Then, the ingot was pulverized by a stamp mill; a ball mill or the like in an inert atmosphere (e.g., nitrogen) to form powder of the ingot material.

(Classifying Step)

The powdered ingot material was sieved to classify to a particle diameter of 125 µm or below.

(Synthesizing Step)

A pulsed current was applied through the powdered material 14 (hereinafter called the powder material 14) by the same spark plasma sintering device 10 as shown in FIG. 3 to cause an electrical discharge among the particles of the powder to synthesize compound $PbBi_2Te_4$ with a uniform structure and also to form a sintered body 141 of the compound $PbBi_2Te_4$.

The powder material 14 was sintered under conditions of a temperature of 500° C. and a pressure of 400 kgf/cm² for two hours.

As a result, the compound was synthesized and sintered at the same time to form the sintered body 14' of the compound $PbBi_2Te_4$ with a very uniform structure.

Figure 14:
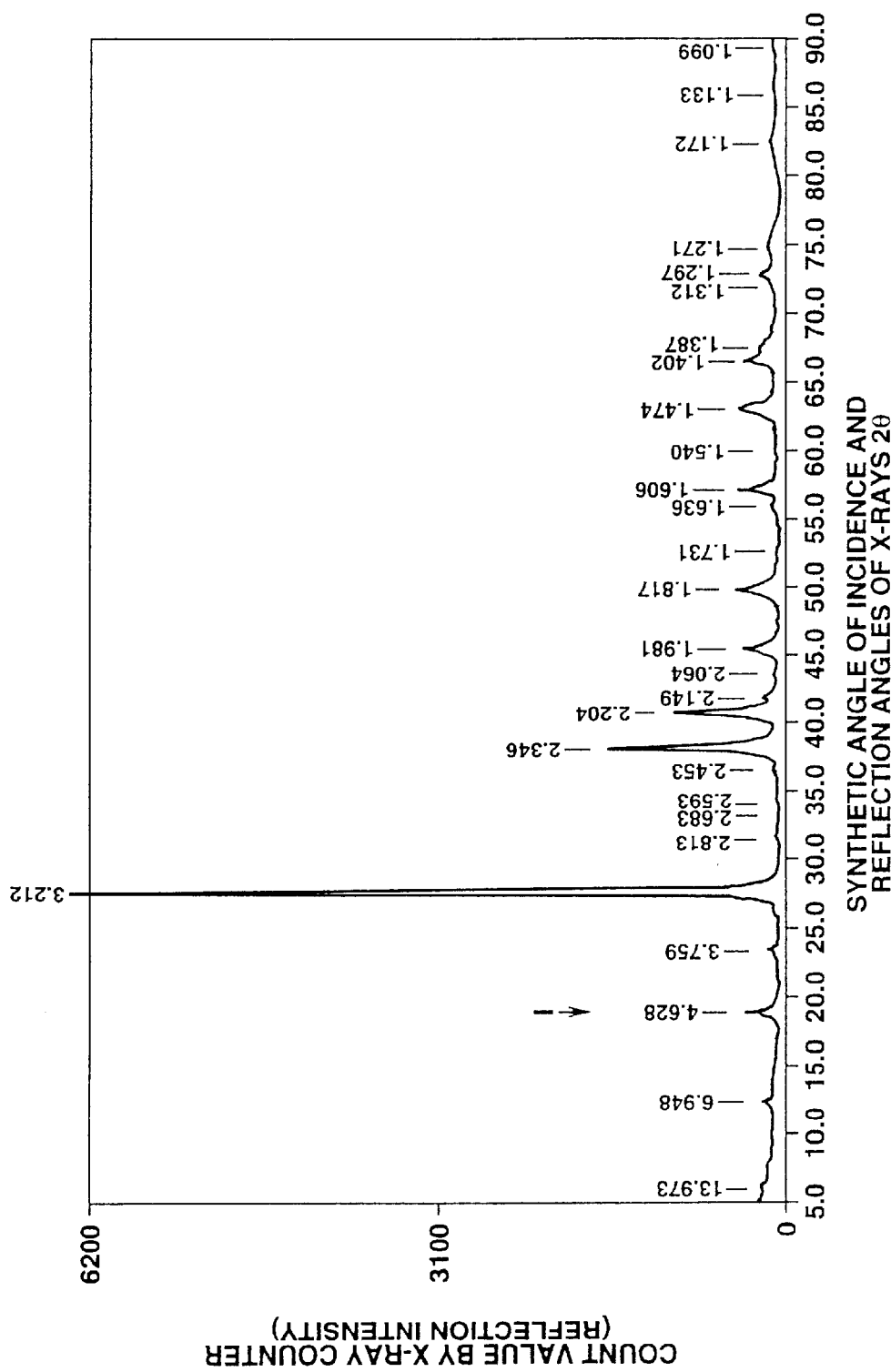
FIG. 14 is a diagram showing measured results of x-ray reflection intensity according to the embodiment.

FIG. 14 shows the results of analyzing the crystalline structure (composition) of the compound, which was obtained by the aforesaid spark plasma method, by the X-ray diffraction method.

Similar to FIG. 13, the horizontal axis of FIG. 14 is angle 2θ having an incidence angle and a reflection angle of X-rays synthesized and the vertical axis indicates a count value (reflection intensity) of an X-ray counter. Lattice spacing d (angstrom) is obtained from the synthetic angle 2θ. According to publication data, the crystalline structure of the compound $PbBi_2Te_4$ shows lattice spacing d=4.61 (angstrom) with index of the plane (h, k, 1)=(0, 0, 9).

According to FIG. 14, a peak of d=4.628 corresponding to a theoretical value 4.61 was observed as indicated by arrow I. Differing from FIG. 13, a peak showing a crystalline structure other than the target one was not observed. Thus, it was found from the results of the X-ray analysis that the compound $PbBi_2Te_4$ having the same uniform structure as the target Rucklidgeite mineral (structural formula:$(Pb, Bi)_3Te_4$) was synthesized.

In this embodiment, the spark plasma sintering device 10 was used to apply a pulsed current and a pressure to the powder material 14 at the same time to synthesize and solidify the compound simultaneously. But, it is not essential to solidify the powder material 14 at the same time.

As an order of the steps, a pressure may be applied after applying a pulsed current to the powder material 14. And, the pulsed current may be applied after applying a pressure to the powder material 14.

Now, a method of producing compound $PbBi_2Te_4$ by a process different from the aforesaid synthesizing example 1 will be described.

Synthesizing Example 2

(Heating Step):

First, respective elements as materials for a thermoelectric semiconductor material, namely Pb and Te, were sealed into a glass tube under decompression and melted to form a PbTe compound. Similarly, Bi and Te were sealed into a glass tube under decompression and melted to form a $Bi_2Te_3$ compound.

(Solidifying Step)

The molten PbTe compound and $Bi_2Te_3$ compound were solidified by solidifying in one direction to produce ingot materials of the PbTe compound and the $Bi_2Te_3$ compound.

(Pulverizing Step)

The respective ingots of the PbTe compound and the $Bi_2Te_3$ compound were pulverized by a stamp mill, a ball mill or the like in an inert atmosphere (e.g., nitrogen) to produce powder from the ingot materials of the PbTe compound and the $Bi_2Te_3$ compound.

(Classifying Step)

Each powder of the ingot materials of the PbTe compound and the $Bi_2Te_3$ compound was sieved and classified to a particle diameter of 125 µm or below.

(Mixing Step)

The powder of the ingot material of the PbTe compound having a predetermined particle diameter or below and the powder of the ingot material of the $Bi_2Te_3$ compound also having a predetermined particle diameter or below were weighed to be a stoichiometric ratio of 1:1 and mixed.

(Synthesizing Step)

Using the spark plasma sintering device 10 shown in FIG. 3, a pulsed current was applied to the mixed powder material 14 to cause an electrical discharge among the particles of the powder to synthesize compound $PbBi_2Te_4$ having a uniform structure and also to form a sintered body 14' of the compound $PbBi_2Te_4$. Sintering conditions are same to the synthesizing example 1, and the powder material 14 is sintered under conditions of a temperature of 500° C. and a pressure of 400 kgf/cm² for two hours.

As a result, in the same way as in the synthesizing example 1, the compound was synthesized and sintered simultaneously by the spark plasma sintering device 10 to produce the sintered body 14' of the compound $PbBi_2Te_4$ having a very uniform structure.

In the synthesizing example 2, the spark plasma sintering device 10 is used to apply a pulsed current and a pressure to the powder material 14 at the same time so to synthesize and sinter the compound simultaneously. But, it is not essential to solidify the powder material 14 at the same time. As an order of the steps, a pressure may be applied after applying a pulsed current to the powder material 14. And, the pulsed current may be applied after applying a pressure to the powder material 14.

In the synthesizing example 2, the elements Pb, Te and Bi are used as the starting materials, but a compound, an alloy or the like containing such elements may be used as the starting material. Specifically, the starting material may be as follows.

(1) Ingot body
(2) Compound (intermetallic compound)
(3) Eutectic mixture (4) Mixture having (1), (2) and (3) combined appropriately The aforesaid (1) and (2) are collectively called the compound in a broad sense. The above (1) and (2) have a single stable crystalline structure. And, (3) and (4) have a plurality of crystalline structures. These (1), (2), (3) and (4) are collectively called an alloy.

In short, the starting material may be a mixture having a plurality of crystalline structures or a compound having a single crystalline structure as long as the finally synthesized compound ($PbBi_2Te_4$) has a single crystalline structure. In other words, the material may be an element or an alloy in the steps (melting, solidifying, pulverizing and classifying Steps) on the way to the synthesizing step if it finally becomes a compound through the synthesizing step.

Now, a method of producing a compound by a process different from the synthesizing examples 1 and 2 will be described. Synthesizing example 3 will synthesize a $CoSb_3$ compound which attracts attention as a thermoelectric semiconductor material lately. Similar to the $PbBi_2Te_4$ compound, the $CoSb_3$ compound is a material from which a uniform compound cannot be synthesized by the melting and solidifying method.

Synthesizing example 3
(Pulverizing Step)

First, ingots of respective elements as raw materials for a thermoelectric semiconductor material, namely cobalt Co and antimony Sb ingots were prepared and respectively pulverized by a stamp mill, ball mill or the like in an inert atmosphere (e.g., nitrogen) to produce each powder of Co and Sb.
(Classifying Step)

The Co powder and the Sb powder were sieved to classify to a particle diameter of 125 μm or below.
(Mixing Step)

The Co powder and the Sb powder each having a predetermined particle diameter or below were weighed to be a stoichiometric ratio of 1:3 and mixed.

Using the spark plasma sintering device 10 shown in FIG. 3, a pulsed current was applied to the mixed powder material 14 to cause an electrical discharge among the particles of the powder to synthesize compound $CoSb_3$ having a uniform structure and also to form a sintered body 14' of the compound $CoSb_3$. Sintering conditions are to sinter the powder material 14 at a temperature of 600° C. and a pressure of 400 kgf/cm² for two hours.

As a result, similar to the synthesizing examples 1 and 2, the compound was synthesized and sintered by the spark plasma sintering device 10 simultaneously to produce the sintered body 14' of the compound $CoSb_3$ having a very uniform structure. It was also confirmed by the X-ray analysis that the compound was a single phase of $CoSb_3$.

In the synthesizing example 3, the spark plasma sintering device 10 is used to apply a pulsed current and a pressure to the powder material 14 at the same time so to synthesize and sinter the compound simultaneously. But, it is not essential to solidify the powder material 14 at the same time. As an order of the steps, a pressure may be applied after following a pulsed current to the powder material 14. And, the pulsed current may be applied after applying a pressure to the powder material 14.

FIG. 11 shows synthesizing examples 4 through 18 of other compounds.

Each synthesizing example is shown with a "composition" of a compound synthesized, a "synthesizing method" for indicating whether the synthesis was conducted by the same synthesizing method as the synthesizing example 1 or 2 ("1" indicates the same synthesizing method as the synthesizing example 1 and "2" indicates the same synthesizing method as the synthesizing example 2), a "compound" used when synthesized by the same synthesizing method as the synthesizing example 2, a "temperature" for heating the powder, a "time" for sintering, and a "synthesized result" indicating whether the synthesized compound is uniform (o) or not (x). For comparison, synthesizing example 19 of compound $PbBi_2Te_4$ by a hot pressing device is referred to. In the synthesizing example 19, in the same way as in the synthesizing example 2, a $PbBi_2Te_4$ compound was synthesized from a PbTe compound and a $Bi_2Te_3$ compound by the hot pressing device. In these synthesizing examples, a pressure was determined to be 400 kgf/cm².

In the synthesizing examples 4 through 18, the synthesis was performed by the same synthesizing method as in the synthesizing example 1. Among these synthesizing examples 4 through 18, when the synthesis was performed by the same synthesizing method as in the synthesizing example 2, a "compound" used is specified.

In the synthesizing examples 4 through 18, the results of synthesis were "o", while the result of synthesis in the synthesizing example 19 using the hot pressing was "x". Thus, it was found that the compound according to the producing method of this embodiment has a very uniform structure as compared with the compound synthesized by the hot pressing.

According to this embodiment, when the synthesis is performed in the same way as the synthesizing example 2, the compounds used for the synthesis are two or three kinds, but four or more kinds of compounds may be used to synthesize a compound.

The sintered body 14' of the compound synthesized according to the methods exemplified in the synthesizing examples is cut to have a thermoelectric semiconductor material with a shape suitable for the application of a thermoelectric element. For example, when it is required to have a doughnut shape for the application of the thermoelectric element, the rectangular sintered body 14' is cut to have a doughnut-shaped material, which is then machined.

What is claimed is:

1. A method of producing a thermoelectric semiconductor material, comprising synthesizing a compound having a uniform structure represented by chemical formula $AB_2X_4$, where A is a simple substance or mixture of Pb, Sn and Ge (IV family elements), B is a simple substance or mixture of Bi and Sb (V family elements), and X is-a simple substance or mixture of Te and Se (VI family elements), by applying a pulsed current to material powder for the thermoelectric semiconductor material having the A, B and X mixed in a stoichiometric ratio of 1:2:4 to cause an electrical discharge among particles of the powder.

2. A method of producing a thermoelectric semiconductor material, comprising synthesizing a compound having a uniform structure represented by chemical formula $Bi_{1-x}Sb_xTe_1$ by applying a pulsed current to material powder for the thermoelectric semiconductor material having Bi, Sb and Te mixed in a stoichiometric ratio of 1−x:x:1 (where, $0 \leq x \leq 1$) to cause an electrical discharge among particles of the powder.

3. A method of producing a thermoelectric semiconductor material, comprising synthesizing a compound having a uniform structure represented by chemical formula $A_yB_{1-y}X_1$, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current to material powder for the thermoelectric semiconductor material having the A, B and X mixed in a stoichiometric. ratio of y:1−y:1(where, $0 \leq y \leq 0.25$) to cause an electrical discharge among particles of the powder.

4. A method of producing a thermoelectric semiconductor material, comprising synthesizing a compound having a uniform structure represented by chemical formula $AB_2X_4$ as well as forming a sintered body of the compound, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current and a pressure to material powder for the thermoelectric semiconductor material having A, B and X mixed in a stoichiometric ratio of 1:2:4 to cause an electrical discharge among particles of the powder.

5. A method of producing a thermoelectric semiconductor material, comprising synthesizing a compound having a uniform structure represented by chemical formula $Bi_{1-x}Sb_xTe_1$ as well as forming a sintered body of the compound by applying a pulsed current and a pressure to material powder for the thermoelectric semiconductor material having Bi, Sb and Te mixed in a stoichiometric ratio of 1−x:x:1 (where, $0 \leq x \leq 11$) to cause an electrical discharge among particles of the powder.

6. A method of producing a thermoelectric semiconductor material, comprising synthesizing a compound having a uniforms structure represented by chemical formula $A_yB_{1-y}X_1$ as well as forming a sintered body of the compound, where A is a simple substance or mixture of Pb, Sn and Ge (IV family elements), B is a simple substance or mixture of Bi and Sb (V family elements), and X is a simple substance or mixture of Te and Se (VI family elements), by applying a pulsed current and a pressure to material powder for the thermoelectric semiconductor material having A, B and X mixed in a stoichiometric ratio of y:1−y:1 (where, $0 \leq y \leq 0.25$) to cause an electrical discharge among particles of the powder.

7. A method of producing a thermoelectric semiconductor material including a synthesizing step for synthesizing a compound having a uniform structure by applying a pulsed current through a material powder for the thermoelectric semiconductor material having a desired structure to cause an electrical discharge among particles of the powder, the material powder for the thermoelectric semiconductor material having the desired structure being a mixture of powder of at least two kinds of elements or alloys, and the synthesized compound is a new compound different from the at least two kinds of elements or alloys.

8. A method of producing a thermoelectric semiconductor material including a synthesizing step for synthesizing a compound having a uniform structure by applying a pulsed current through a material powder for the thermoelectric semiconductor material having a desired structure to cause an electrical discharge among particles of the powder, the material powder for the thermoelectric semiconductor material having the desired structure being a mixture of powder of at least two different compounds.

9. A method of producing a thermoelectric semiconductor material, comprising:
a step of mixing respective elements as raw materials for the thermoelectric semiconductor material so to have a desired structure and heating to melt the mixture;
a step of solidifying the heated and melted mixture of the respective elements to form an ingot material for the thermoelectric semiconductor material;
a step of pulverizing the ingot material to form powder of the ingot material;
a step of classifying the powder of the ingot material to a predetermined particle diameter or below; and
a step of synthesizing a compound having a uniform structure and also forming a sintered body of the compound by applying a pulsed current and a pressure to the powder of the ingot material having the predetermined particle diameter or below to cause an electrical discharge among particles of the powder.

10. A method of producing a thermoelectric semiconductor material, comprising:
a step of heating to melt at least two kinds of elements or alloys as raw materials for the thermoelectric semiconductor material;
a step of solidifying the respective heated and melted elements or alloys to form ingot materials of the respective elements or alloys;
a step of pulverizing the ingot materials of the respective elements or alloys to form powder of the ingot materials of the respective elements or alloys;
a step of classifying the powder of the ingot materials of the respective elements or alloys to a predetermined particle diameter or below;
a step of mixing the powder of the ingot materials of the respective elements or alloys having the predetermined particle diameter or below so to have a desired composition; and
a step of synthesizing a new kind of compound different from the at least two kinds of elements or alloys and also forming a sintered body of the new compound by applying a pulsed current and a pressure to the mixture of the powders of the ingot materials of the respective elements or alloys to cause an electrical discharge among particles of the powder to synthesize.

11. A method of producing a thermoelectric semiconductor material, comprising:
a step of pulverizing respective ingots of at least two kinds of elements as raw materials for the thermoelectric semiconductor material to form powder of the each element;
a step of classifying the powder of the each element to a predetermined particle diameter or below;
a step of mixing the powders of the respective elements having. the predetermined particle diameter or below so to have a predetermined composition; and
a step of synthesizing a compound having a uniform structure and also forming a sintered body of the compound by applying a pulsed current and a pressure to the mixture of the powders of the respective elements to cause an electrical discharge among particles of the powder to synthesize.

12. A thermoelectric semiconductor material, characterized by having chemical formula $Bi_{1-x}Sb_xTe_{1-y}Se_y$ (where, $0 \leq x \leq 1$ and $0 \leq y \leq 1$).

13. A thermoelectric semiconductor material, characterized by having chemical formula $Bi_{2-x}Sb_xTe_{1-y}Se_y$ (where, $0 \leq x \leq 2$ and $0 \leq y \leq 1$).

14. A thermoelectric semiconductor material, characterized by having chemical formula $(Bi_{1-x}Sb_x)_4(Te_{1-y}Se_y)_5$ (where, $0 \leq x \leq 1$ and $0 \leq y \leq 1$).

15. A method of producing a thermoelectric semiconductor material, comprising synthesizing a compound having a uniform structure represented by chemical formula $Bi_{1-x}Sb_xTe_{1-y}Se_y$ by applying a pulsed current to material powder for the thermoelectric semiconductor material having Bi, Sb, Te and Se mixed in a stoichiometric ratio of 1−x:x:1−y:y (where, $0 \leq x \leq 1$ and $0 \leq y \leq 1$) to cause an electrical discharge among particles of the powder.

16. A method of producing a thermoelectric semiconductor material, comprising synthesizing a compound having a uniform structure represented by chemical formula $Bi_{2-x}Sb_xTe_{1-y}Se_y$ by applying a pulsed current to material powder for the thermoelectric semiconductor material having Bi, Sb, Te and Se mixed in a stoichiometric ratio of 2−x:x:1−y:y (where, $0 \leq x \leq 2$ and $0 \leq y \leq 1$) to cause an electrical discharge among particles of the powder.

17. A method of producing a thermoelectric semiconductor material, comprising synthesizing a compound having a uniform structure represented by chemical formula $(Bi_{1-x}Sb_x)_4(Te_{1-y}Se_y)_5$ by applying a pulsed current to material powder for the thermoelectric semiconductor material having Bi, Sb, Te and Se mixed in a stoichiometric ratio of 4(1−x):4x:5(1−y):5y (where, $0 \leq x \leq 1$ and $0 \leq y \leq 1$) to cause an electrical discharge among particles of the powder.

* * * * *